United States Patent
Choi

(10) Patent No.: US 12,113,381 B2
(45) Date of Patent: Oct. 8, 2024

(54) ELECTRONIC DEVICE FOR CHARGING MULTIPLE BATTERIES

(71) Applicant: SAMSUNG ELECTRONICS CO., LTD., Suwon-si (KR)

(72) Inventor: Hangseok Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 392 days.

(21) Appl. No.: 17/500,561

(22) Filed: Oct. 13, 2021

(65) Prior Publication Data
US 2022/0077695 A1 Mar. 10, 2022

Related U.S. Application Data

(63) Continuation of application No. PCT/KR2021/011520, filed on Aug. 27, 2021.

(30) Foreign Application Priority Data

Sep. 10, 2020 (KR) .................. 10-2020-0116269

(51) Int. Cl.
*H01M 10/46* (2006.01)
*H02J 7/00* (2006.01)

(52) U.S. Cl.
CPC .......... *H02J 7/0016* (2013.01); *H02J 7/0029* (2013.01); *H02J 7/0048* (2020.01)

(58) Field of Classification Search
CPC ...... H02J 7/0029; H02J 7/0016; H02J 7/0048; H02J 7/0045; H02J 7/0047
(Continued)

(56) References Cited

U.S. PATENT DOCUMENTS 5,610,495 A * 3/1997 Yee ...................... H01M 10/48
320/DIG. 13
7,342,768 B2 3/2008 Doljack et al.
(Continued)

FOREIGN PATENT DOCUMENTS

GB 2578828 5/2020
JP 4928618 2/2012
(Continued)

OTHER PUBLICATIONS

International Search Report dated Dec. 6, 2021 in counterpart International Patent Application No. PCT/KR2021/011520.
(Continued)

*Primary Examiner* — Edward Tso
(74) *Attorney, Agent, or Firm* — NIXON & VANDERHYE P.C.

(57) ABSTRACT

In various embodiments, an electronic device may include: a connection terminal configured to connect to an external power supply device; a switching circuit including an input terminal connected to the connection terminal, a first output terminal, and a second output terminal; a first battery and a second battery connected to the power supply device in series through the first output terminal and physically separated from each other; a charging circuit configured to adjust a voltage or a current of power received through the second output terminal and output the adjusted voltage or current to the first battery and the second battery; a monitoring circuit configured to monitor a voltage of the first battery and a voltage of the second battery; a protection circuit configured to monitor a current charged to the first battery and a current charged to the second battery and to suspend charging of the first battery and charging of the second battery; and a processor connected to the switching circuit, the charging circuit, the monitoring circuit, and the protection circuit, and connected to the power supply device through the connec-
(Continued)

tion terminal. The processor may be configured to: control the switching circuit to connect the input terminal to the first output terminal or the second output terminal; select one of the first battery and the second battery as a first sensing object based on data indicating the voltage of the first battery and data indicating the voltage of the second battery, the data being received from the monitoring circuit; output a first control signal causing suspension of charging of the first sensing object to the protection circuit on the basis of a result of monitoring of a current output from the first sensing object; select another one of the first battery and the second battery as a second sensing object based on the suspension of the charging of the first sensing object; and output a second control signal causing suspension of charging of the second sensing object to the protection circuit based on a result of monitoring of a current output from the second sensing object.

15 Claims, 12 Drawing Sheets

(58) Field of Classification Search
USPC .......................... 320/107, 114, 116, 118, 132
See application file for complete search history.

(56) References Cited

U.S. PATENT DOCUMENTS

| | | |
|---|---|---|
| 7,994,756 B2 | 8/2011 | Rowland |
| 8,581,547 B2 | 11/2013 | Hoff |
| 2012/0293127 A1 | 11/2012 | Higashi et al. |
| 2019/0006722 A1 | 1/2019 | Kim et al. |
| 2019/0214837 A1 | 7/2019 | Kristjansson |
| 2020/0036198 A1 | 1/2020 | Kim et al. |
| 2020/0144829 A1 | 5/2020 | Lee et al. |
| 2020/0259342 A1 | 8/2020 | Chen et al. |
| 2022/0029439 A1* | 1/2022 | Justin .................... H02J 7/0071 |
| 2023/0268763 A1 | 8/2023 | Li |

FOREIGN PATENT DOCUMENTS

| | | |
|---|---|---|
| JP | 2015-195653 | 11/2015 |
| KR | 10-2009-0119683 | 11/2009 |
| KR | 10-2019-0001830 | 1/2019 |
| KR | 10-2020-0012105 | 2/2020 |

OTHER PUBLICATIONS

Extended European Search Report for EP Application No. 21867029.7 dated Apr. 25, 2024, 9 pages.

* cited by examiner

ELECTRONIC DEVICE FOR CHARGING MULTIPLE BATTERIES

TECHNICAL FIELD

The disclosure relates to an electronic device configured to charge a battery at a constant current (CC) and a constant voltage (CV) by controlling an output current and an output voltage of a charging circuit.

BACKGROUND ART

When a voltage output from a power management circuit (e.g., a charging circuit) to a battery is lower than a designated target value, an electronic device may control the power management circuit to charge a battery at the CC. When the output voltage of the power management circuit reaches the target voltage value during the CC charging, the electronic device may control the power management circuit to charge the battery at the CV. For example, the electronic device may operate in a way of gradually decreasing the output current of the power management circuit (for example, the current introduced into the battery), wherein the battery is fully charged while the output voltage of the power management circuit is maintained at the target voltage value. The target voltage value may be identical to a difference between voltages (full charge voltages) of an anode (+) and a cathode (−) of the battery when the battery is fully charged. The fully charged may refer, for example, to a state of charge (SOC) when the charged amount of the battery reaches 100% of a configured maximum capacity without concern for damage or explosion. For example, when the current output to the battery is equal to or less than a reference value during battery charging at the CV, the electronic device may determine that the battery is fully charged and terminate the battery charging.

The output voltage of the power management circuit may be higher than the voltage of the battery by the voltage dropped by an active/passive element or a line disposed between the power management circuit and the battery. Accordingly, if a charging scheme is changed from the CC to the CV when the output voltage of the power management circuit reaches the target voltage value, a charged current decreases before the voltage of the battery reaches the target voltage value, and consequently, it may take a longer time to fully charge the battery. The electronic device may directly detect the voltage of the battery. Accordingly, the CC is maintained until the voltage of the battery reaches the target voltage value, whereby the battery can be fully charged within a relatively short time.

DISCLOSURE OF INVENTION

Technical Problem

To charge a battery at a high speed, high current is required. The high current may be a burden when designing a circuit or wiring for battery charging. When multiple batteries (each battery may be referred to as a "battery cell") are connected to a charging circuit in series, the battery can be charged at a high speed by increasing a voltage rather than increasing a current. When the multiple battery cells are connected in series, an electronic device may include a cell balancing circuit for balancing the voltages of the battery cells to make the charging amounts of the multiple battery cells identical. When each of the battery cells has the same capacity, the electronic device may fully charge the battery cells in the same scheme (CC or CV scheme) as that used to fully charge a single battery cell. A system (e.g., a processor) of the electronic device and the battery cells may be connected in series, and a sum (e.g., 7V or higher) of voltages of battery cells in series may be higher than a voltage (e.g., 5V or lower) required to operate the system. Accordingly, an electronic device may further include a converter (e.g., a step-down converter) for supplying the system with a lower voltage when power is supplied from a battery pack to the system.

The electronic device may include a foldable housing. For example, the foldable housing may be divided into two housings with reference to a folding axis. A battery cell and a system may be arranged in each housing. Battery cells arranged in each housing may have different capacities. When the battery cells are physically separated from each other and/or the cells have different capacities, it is difficult to achieve cell balancing. For example, due to a resistance component existing in a line for connecting physically separated cells, it is more difficult to achieve the cell balancing.

Embodiments of the disclosure provide an electronic device which enables all battery cells to be fully and promptly charged, wherein the battery cells are physically separated from each other and have different capacities.

Solution to Problem

According to various example embodiments, an electronic device may include: a connection terminal configured to connect to an external power supply device; a switching circuit including an input terminal connected to the connection terminal, a first output terminal, and a second output terminal; a first battery and a second battery connected to the power supply device in series through the first output terminal and physically separated from each other; a charging circuit configured to adjust a voltage or a current of power received through the second output terminal and output the adjusted voltage or current to the first battery and the second battery; a monitoring circuit configured to monitor a voltage of the first battery and a voltage of the second battery; a protection circuit configured to monitor a current charged to the first battery and a current charged to the second battery and to suspend charging of the first battery and charging of the second battery; and a processor connected to the switching circuit, the charging circuit, the monitoring circuit, and the protection circuit, and connected to the power supply device through the connection terminal. The processor may be configured to: control the switching circuit to connect the input terminal to the first output terminal or the second output terminal; select one of the first battery and the second battery as a first sensing object using data indicating the voltage of the first battery and data indicating the voltage of the second battery, the data being received from the monitoring circuit; output a first control signal causing suspension of charging of the first sensing object to the protection circuit based on a result of monitoring of a current output from the first sensing object; select another one of the first battery and the second battery as a second sensing object based on the suspension of the charging of the first sensing object; and output a second control signal causing suspension of charging of the second sensing object to the protection circuit based on a result of monitoring of a current output from the second sensing object.

Advantageous Effects of Invention

According to various example embodiments, an electronic device can charge multiple battery cells through cell balancing, wherein the multiple battery cells are physical separated from each other and have different capacities.

According to various example embodiments, an electronic device can reduce a time taken to fully charge multiple batteries, wherein the multiple battery cells are physically separated from each other and have different capacities.

BRIEF DESCRIPTION OF DRAWINGS

The above and other aspects, features and advantages of certain embodiments of the present disclosure will be more apparent from the following detailed description, taken in conjunction with the accompanying drawings, in which.

MODE FOR THE INVENTION

Figure 1:
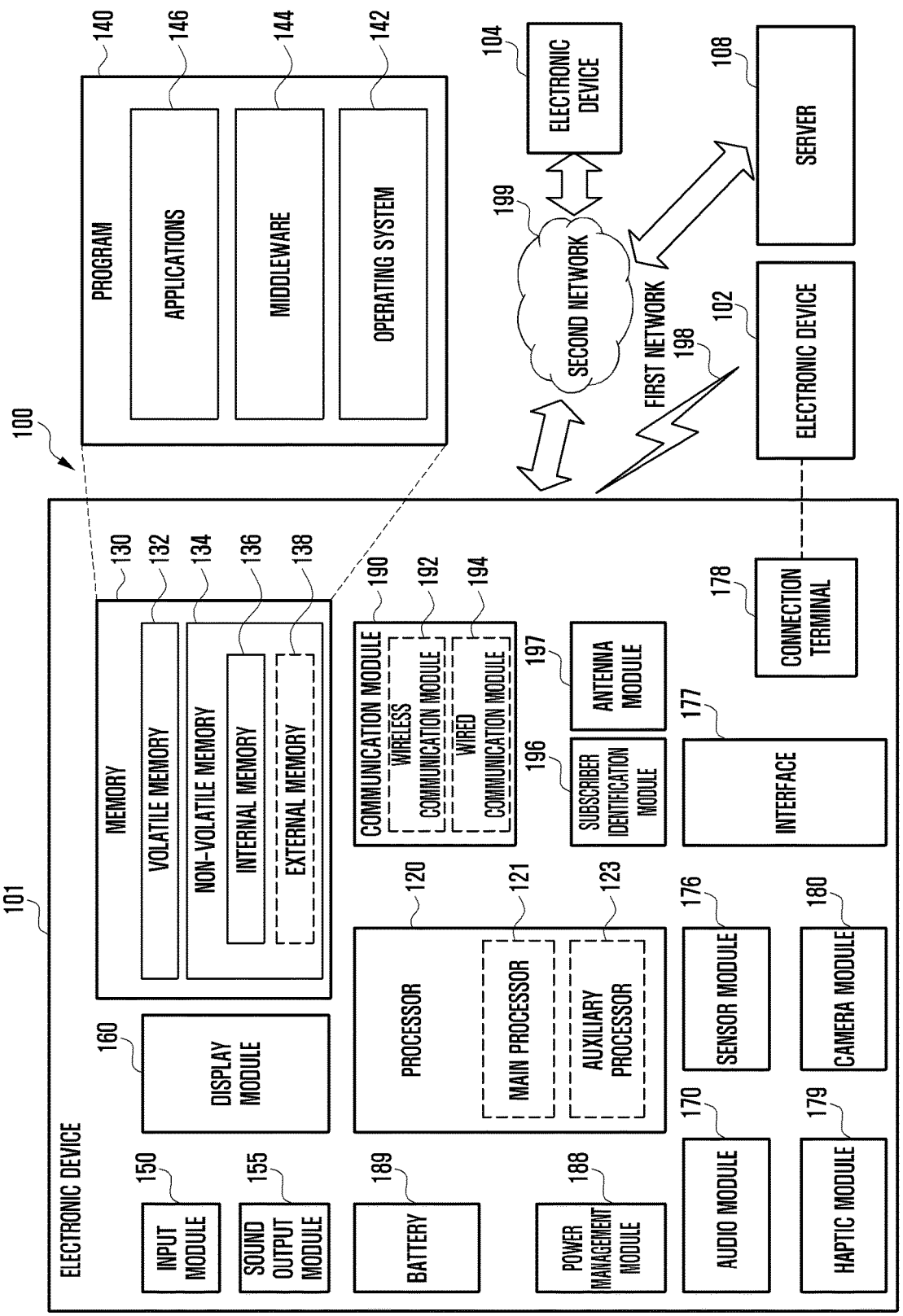
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IOT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
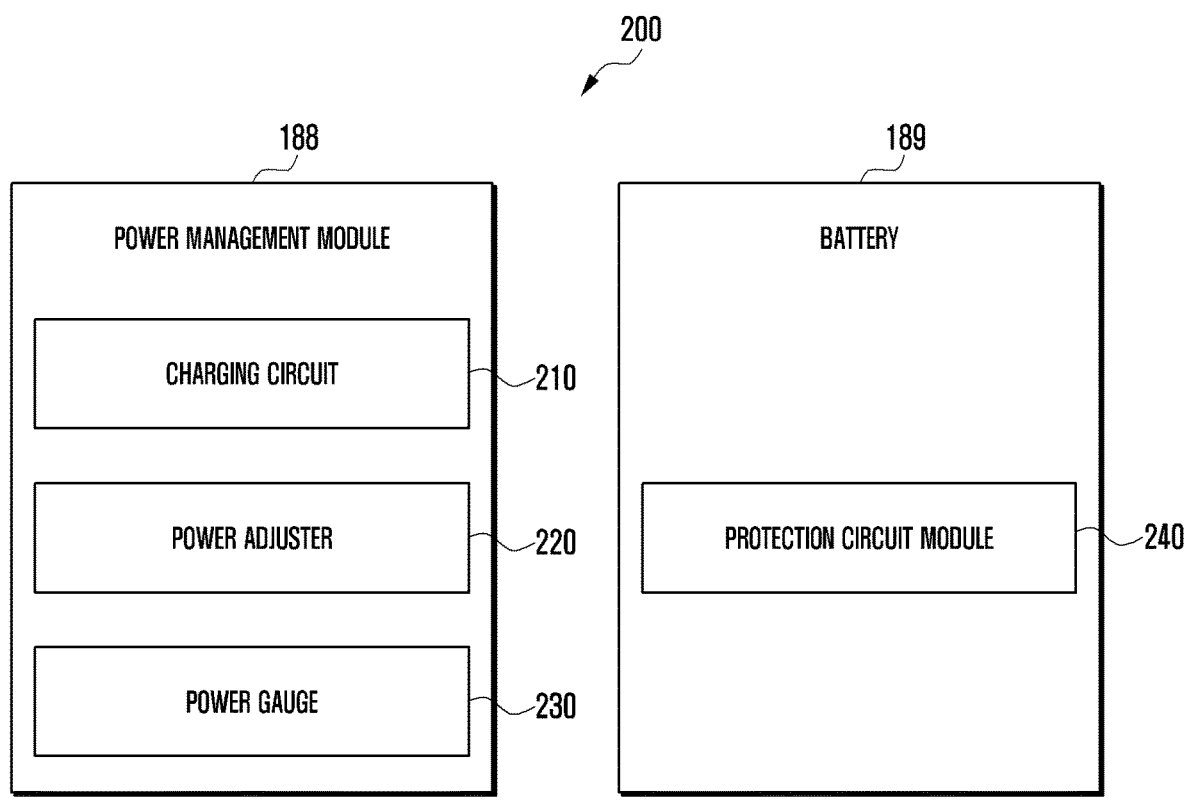
FIG. 2 is a block diagram illustrating an example power management module and a battery according to various embodiments.

FIG. 2 is a block diagram 200 illustrating an example configuration of a power management module 188 and a battery 189 according to various embodiments. Referring to FIG. 2, the power management module 188 may include charging circuitry 210, a power adjuster (e.g., including power adjusting circuitry) 220, or a power gauge (e.g., including power measuring circuitry) 230. The charging circuitry 210 may charge the battery 189 using power supplied from an external power source outside the electronic device 101. According to an embodiment, the charging circuitry 210 may select a charging scheme (e.g., normal charging or quick charging) based at least in part on a type of the external power source (e.g., a power outlet, a USB, or wireless charging), magnitude of power suppliable from the external power source (e.g., about 20 Watt or more), or an attribute of the battery 189, and may charge the battery 189 using the selected charging scheme. The external power source may be connected with the electronic device 101, for example, directly via the connecting terminal 178 or wirelessly via the antenna module 197.

The power adjuster 220 may include various power adjusting circuitry and generate a plurality of powers having different voltage levels or different current levels by adjusting a voltage level or a current level of the power supplied from the external power source or the battery 189. The power adjuster 220 may adjust the voltage level or the current level of the power supplied from the external power source or the battery 189 into a different voltage level or current level appropriate for each of some of the components included in the electronic device 101. According to an embodiment, the power adjuster 220 may be implemented in the form of a low drop out (LDO) regulator or a switching regulator. The power gauge 230 may include various power measuring circuitry and measure use state information about the battery 189 (e.g., a capacity, a number of times of charging or discharging, a voltage, or a temperature of the battery 189).

The power management module 188 may determine, using, for example, the charging circuitry 210, the power adjuster 220, or the power gauge 230, charging state information (e.g., lifetime, over voltage, low voltage, over current, over charge, over discharge, overheat, short, or swelling) related to the charging of the battery 189 based at least in part on the measured use state information about the battery 189. The power management module 188 may determine whether the state of the battery 189 is normal or abnormal based at least in part on the determined charging state information. If the state of the battery 189 is determined to abnormal, the power management module 188 may adjust the charging of the battery 189 (e.g., reduce the charging current or voltage, or stop the charging). According to an embodiment, at least some of the functions of the power management module 188 may be performed by an external control device (e.g., the processor 120).

The battery 189, according to an embodiment, may include a protection circuit module (PCM) (e.g., including various protection circuitry) 240. The PCM 240 may perform one or more of various functions (e.g., a pre-cutoff function) to prevent and/or reduce a performance deterioration of, or a damage to, the battery 189. The PCM 240, additionally or alternatively, may be configured as at least part of a battery management system (BMS) capable of performing various functions including cell balancing, measurement of battery capacity, count of a number of charging or discharging, measurement of temperature, or measurement of voltage.

According to an embodiment, at least part of the charging state information or use state information regarding the battery 189 may be measured using a corresponding sensor (e.g., a temperature sensor) of the sensor module 176, the power gauge 230, or the power management module 188. According to an embodiment, the corresponding sensor (e.g., a temperature sensor) of the sensor module 176 may be included as part of the PCM 240, or may be disposed near the battery 189 as a separate device.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

A foldable housing having a structure applicable to an electronic device 101 is described with reference to FIGS. 3 and 4. Hereinafter, a surface on which a display (e.g., the display module 160 of FIG. 1) is disposed is referred to as a front surface of an electronic device. A surface opposite to the front surface is referred to as a rear surface of an electronic device. In addition, a surface surrounding a space between the front surface and the rear surface is referred to as a side surface of an electronic device. The term "state" may be used to refer to a structural form, shape, or appearance of an electronic device (or a display).

Figure 3:
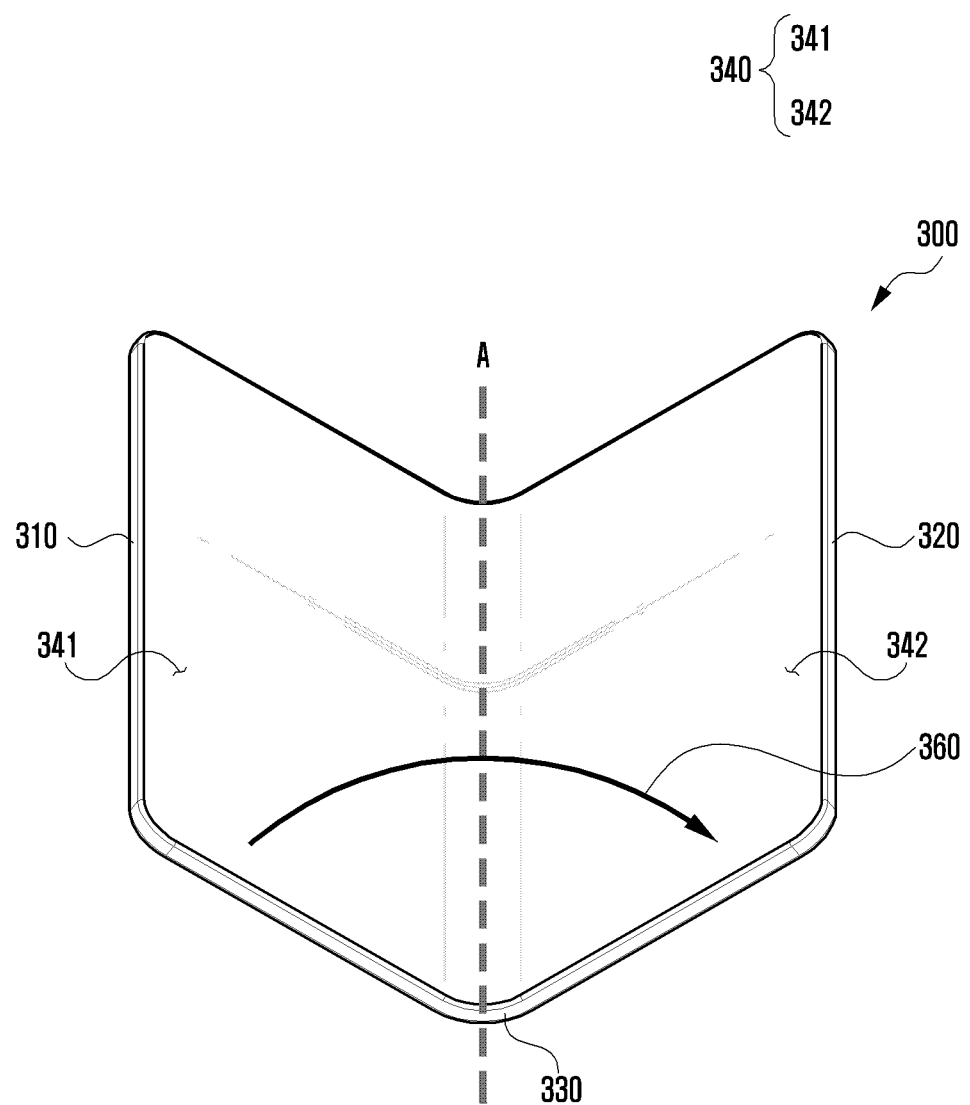
FIG. 3 is a diagram illustrating an example portable electronic device having a housing structure folded according to an in-folding type according to various embodiments.

FIG. 3 is a diagram illustrating an example portable electronic device 300 having a housing structure folded according to an in-folding type according to various embodiments. Referring to FIG. 3, the portable electronic device 300 (e.g., the electronic device 101 of FIG. 1) may include: a first housing 310; a second housing 320; a hinge assembly (e.g., including a hinge) 330 for connecting the first housing 310 and the second housing 320 so that the second housing 320 is rotatable with respect to the first housing 310; and a flexible or a foldable display 340 disposed in a space formed by the foldable housings 310 and 320. The display 340 (e.g., the display module 160 of FIG. 1) may be disposed from the first housing 310 to the second housing 320 across the hinge assembly 330. The display 340 may be divided into a first display area 341 disposed in an inner space of the first housing 310 and a second display area 342 disposed in an inner space of the second housing 320 with reference to a folding axis A. The hinge assembly 330 may be implemented in an in-folding type in which two display areas 341 and 342 face each other when the state switching (e.g., the form switching) of the electronic device 300 from an unfolded, flat, or open state to a folded or closed state occurs. For example, when the electronic device 300 is in the unfolded state, two display areas 341 and 342 may be oriented in the same direction, and when the state switching 360 from the unfolded state to the folded state occurs, two display areas 341 and 342 may be rotated to be oriented opposite to each other. At least one battery (e.g., the battery 189 of FIG. 1) and a system of the portable electronic device 300 (e.g., at least one of the components of FIG. 1) operable by the at least one battery may be arranged in the inner space of the first housing 310. At least one battery (e.g., the battery 189 of FIG. 1) and a system of the portable electronic device 300 (e.g., at least one of the components of FIG. 1) operable by the at least one battery may also be arranged in the inner space of the second housing 320. Although not shown, the portable electronic device 300 may include lines which are arranged in the inner space of each of the first housing 310 and the second housing 320 and is disposed across the hinge assembly 330. For example, data communication between systems distributed and arranged in the housings 310 and 320 is possible through data lines. Battery charging and power supply to the system are possible through power lines. Some of the lines may be arranged on, for example, a flexible printed circuit board (FPCB) disposed crossing the hinge assembly 330. According to an embodiment, multiple batteries may be positioned in one of the first housing 310 or the second housing 320 of the electronic device 300. According to an embodiment, the multiple batteries included in the electronic device 300 may be arranged as battery packs, respectively, or may be arranged in multiple battery cells in a single battery pack.

Figure 4:
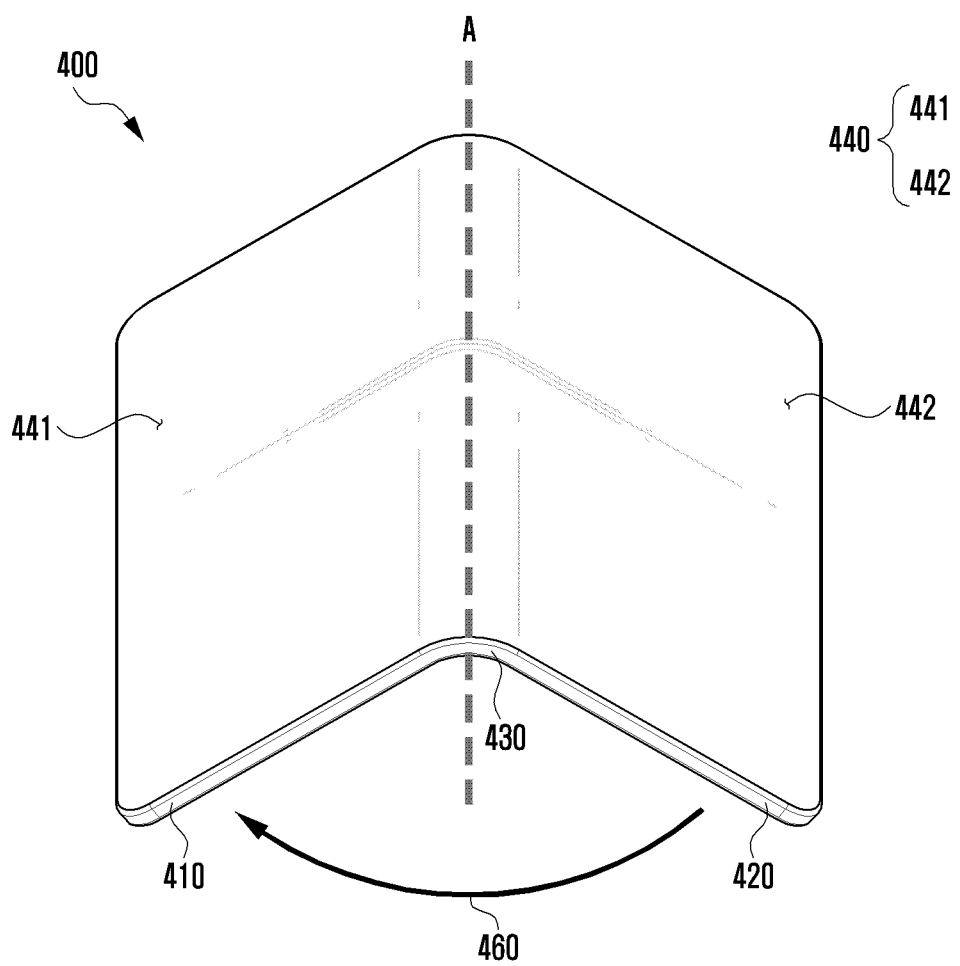
FIG. 4 is a diagram illustrating an example portable electronic device having a housing structure folded according to an out-folding type according to various embodiments.

FIG. 4 is a diagram illustrating an example portable electronic device 400 having a housing structure folded according to an out-folding type according to various embodiments. In describing the portable electronic device 400, the configuration, the function, and/or the structure duplicated with those of FIG. 3 may be simply described or may not be repeated. Referring to FIG. 4, the portable electronic device 400 (e.g., the electronic device 101 of FIG. 1) may include a first housing 410, a second housing 420, a hinge assembly 430, and a display 440 disposed in a space formed by the foldable housings 410 and 420. The display 440 (e.g., the display module 160 of FIG. 1) may be divided into a first display area 441 disposed in an inner space of the first housing 410 and a second display area 442 disposed in an inner space of the second housing 420 with reference to a folding axis A. The hinge assembly 430 may be implemented in an out-folding type in which two display areas 441 and 442 are oriented opposite to each other when the state switching of the electronic device 400 from an unfolded state to a folded state occurs. For example, when the electronic device 400 is in the unfolded state, two display areas 441 and 442 may be oriented in the same direction, and when the state switching 460 from the unfolded state to the folded state occurs, two display areas 441 and 442 may be rotated to be oriented opposite to each other.

Figure 5:
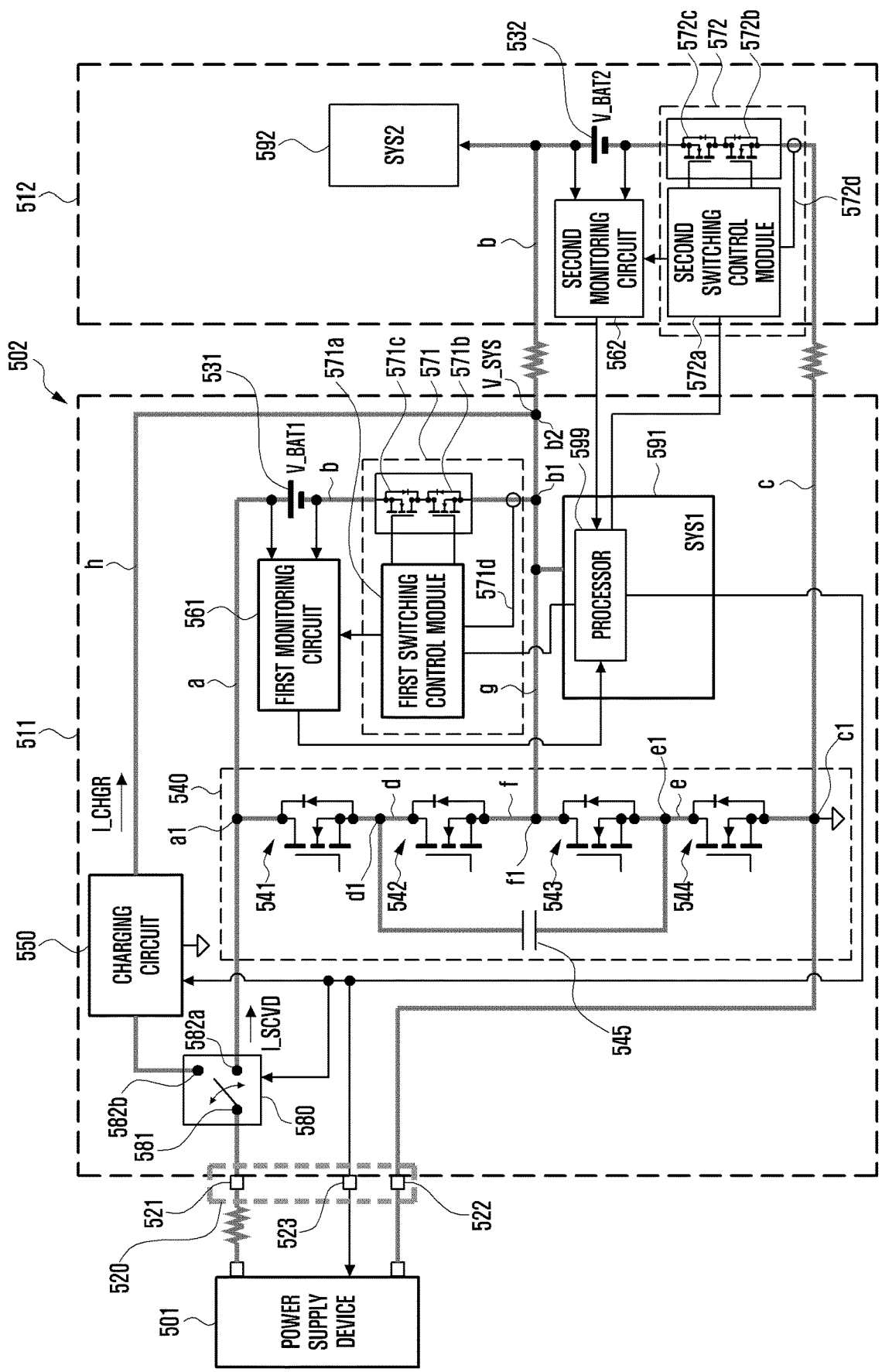
FIG. 5 is a block diagram illustrating an example configuration of a battery charging system according to various embodiments.

FIG. 5 is a block diagram illustrating an example configuration of a battery charging system according to various embodiments. Referring to FIG. 5, the battery charging system may include a power supply device (e.g., a power supply) 501 configured to supply power and an electronic device 502 configured to charge a battery using the power supplied from an external source. The electronic device 502 may include a first housing 511, a second housing 512, a connection terminal 520, a first battery 531, a second battery 532, a cell balancing circuit 540, a charging circuit (or a switching charger) 550, a first monitoring circuit 561, a second monitoring circuit 562, a first protection circuit 571, a second protection circuit 572, a switching circuit 580, a first system 591, a second system 592, and a processor (e.g., including processing circuitry) 599.

The connection terminal 520, the first battery 531, the cell balancing circuit 540, the charging circuit 550, the first monitoring circuit 561, the first protection circuit 571, the switching circuit 580, the first system 591, and the processor 599 may be arranged in an inner space of the first housing 511 (e.g., the first housing 310 of FIG. 3 or the first housing 410 of FIG. 4). The second battery 532, the second monitoring circuit 562, the second protection circuit 572, and the second system 592 may be arranged in an inner space of the second housing 512 (e.g., the second housing 320 of FIG. 3 or the second housing 420 of FIG. 4). Unlike shown in FIG. 5, at least one of the second battery 532, the second monitoring circuit 562, and the second protection circuit 572 may be arranged in the first housing 511. According to an embodiment, the portable electronic device (e.g., the electronic device 101 of FIG. 1) may have, for example, a bar-type housing, and the components above 531, 532, 540, 550, 561, 562, 571, 580, 591, 592, and 599 may be arranged in the bar-type housing.

The power supply device 501 may be electrically connected to the connection terminal 520 of the electronic device 502, and may include an adapter configured to convert a current of a power signal introduced from the outside from an alternating current (AC) into a direct current (DC) and adjust a voltage of power to a designated voltage value (e.g., approx. 10-14V), so as to output the converted current and the adjusted voltage. The adapter may be a model supporting a programmable power supply (PPS) function for CC and CV charging. For example, the adapter may adjust the intensity of a voltage and/or current of power to be output. For example, in response to a control signal received from the electronic device 502 through a cable, the adapter may sequentially decrease or increase the output current by a designated unit current value (e.g., 50 mA) to output the same. In response to a control signal received from the electronic device 502 through a cable, the adapter may sequentially decrease or increase the output voltage by a designated unit voltage value (e.g., 10 mV) to output the same. The adapter may be a model not supporting the PPS function and outputting the current and/or the voltage of power by fixing the same at a designated value. When the adapter corresponds to a model supporting the PPS function, the power supply device 501 may adjust a voltage (or current) of power to be output to the electronic device 502 to a voltage value (or a current value) configured to charge the batteries 531 and 532. When the adapter corresponds to a model not supporting the PPS function, the charging circuit 550 may adjust the voltage (or current) of power received from the power supply device 501 to a voltage value (or a current value) configured to charge the batteries 531 and 532.

The electronic device 502 (e.g., the electronic device 101 of FIG. 1) may be connected to the power supply device 501 through a cable connected to the connection terminal 520 (e.g., the connection terminal 178 of FIG. 1), and may charge the batteries 531 and 532 using power supplied from the power supply device 501 through the cable. According to an embodiment, the power supply device 501 may include a wireless power device. For example, the power supply device 501 may include a conductive coil (not shown) for wirelessly transmitting power. According to an embodiment, the electronic device 502 may include a conductive coil (not shown) for wirelessly receiving power from the power supply device 501. According to an embodiment, the power supply device 501 may include components that are substantially identical to those of the electronic device 502.

The batteries 531 and 532 may be configured to be connected to the power supply device 501 in series. For example, an anode (+) of the first battery 531 may be connected to a positive power terminal 521 in the connection terminal 520 through power line a, and a cathode (−) of the first battery 531 may be connected to an anode (+) of the second battery 532 through power line b crossing the first housing 511 and the second housing 512. A cathode (−) of the second battery 532 may be connected to a cathode (−) of a negative power terminal 522 in the connection terminal 520 through power line c crossing the first housing 511 and the second housing 512.

The cell balancing circuit 540 may be configured to perform an operation of matching the batteries 531 and 532 to have the same voltage according to a control signal received from the processor 599 while the batteries 531 and 532 are charged by power received from the power supply device 501 (or received from the charging circuit 550 (e.g., the charging circuit 210 of FIG. 2) through the connection terminal 520.

In an embodiment for performing the operation, the cell balancing circuit 540 (for example, a switched capacitor voltage divider (SCVD)) may include four switches 541, 542, 543, and 544 and a capacitor 545. Each of the switches 541, 542, 543, and 544 is an ON/OFF switch, and may be implemented as, for example, a metal oxide semiconductor field effect transistor (MOSFET). The switches 541, 542, 543, and 544 may be connected to the power supply device 501 in series. For example, one end of the first switch 541 may be connected to node a1 in power line a, one end of the second switch 542 may be connected to the other end of the first switch 541, one end of the third switch 543 may be connected to the other end of the second switch 542, one end of the fourth switch 544 may be connected to the other end of the third switch 543, and the other end of the fourth switch 544 may be connected to node c1 in power line c. One end of the capacitor 545 may be connected to node d1 in power line d, which connects the other end of the first switch 541 and one end of the second switch 542, and the other end of the capacitor 545 may be connected to node e1 in power line e, which connects the other end of the third switch 543 and one end of the fourth switch 544. Node f1 in power line f, which connects the other end of the second switch 542 and one end of the third switch 543, may be connected to node b1 in power line b through power line g.

At one time point, the first switch 541 and the third switch 543 may be in an ON state (or a closed state), and the second switch 542 and the fourth switch 544 may be in an OFF state (or an open state) (hereinafter, referred to as a "first connection state"). In the first connection state, one end of the capacitor 545 may be connected to the anode (+) of the first battery 531, and the other end of the capacitor 545 may be connected to the cathode (−) of the first battery 531. At another time point, the first switch 541 and the third switch 543 may be in the OFF state, and the second switch 542 and the fourth switch 544 may be in the ON state (hereinafter, referred to as a "second connection state"). When the connection state switches from the first connection state to the second connection state, the capacitor 545 may be electrically disconnected from the first battery 531 and may be electrically connected to the second battery 532. That is, in the second connection state, one end of the capacitor 545 may be connected to the anode (+) of the second battery 532 and the other end of the capacitor 545 may be connected to the cathode (−) of the second battery 532. The processor may control the cell balancing circuit 540 so that the first connection state and the second connection state periodically (e.g., approx. 500 K to 1 MHz) repeat in turn. Accordingly, power may move from a battery having a relatively higher voltage to a battery having a relatively lower voltage through the capacitor 545, and consequently, the voltages of two batteries 531 and 532 may be adjusted to be identical.

The first monitoring circuit 561 (e.g., the power gauge 230 of FIG. 2) may be connected to opposite ends (the anode (+) and the cathode (−)) of the first battery 531 to monitor the voltage of the first battery 531 and output a monitoring result (data indicating a voltage value) to the processor 599. The second monitoring circuit 562 (e.g., the power gauge 230 of FIG. 2) may be connected to opposite ends (the anode (+) and the cathode (−)) of the second battery 532 to monitor the voltage of the second battery 532 and output a monitoring result to the processor 599.

The first protection circuit 571 (e.g., the battery protection circuit 240 of FIG. 2) may be configured to monitor the current output from the first battery 531 and/or the current introduced into the first battery 531, output a monitoring result (data indicating a current value) to the processor 599, and prevent (or suspend) charging and/or discharging of the first battery 531 according to a control signal received from the processor 599. For example, when the first battery 531 is over charged at the level exceeding a configured maximum value (e.g., a full charge voltage value) of the voltage of the first battery 531, the first battery 531 may be damaged or explode. In another example, when the first battery 531 is over-discharged at the level falling short of a configured minimum value of the voltage of the first battery 531, the first battery 531 may be in an unavailable state. In an embodiment, the first protection circuit 571 may include a first switching control module 571a, a first charging prevention switch 571b, and a first discharging prevention switch 571c. The first charging prevention switch 571b and the first discharging prevention switch 571c may be positioned between the first battery 531 and node b1 in power line b. In an embodiment, the first switching control module 571a may identify the current flowing through a line 571d electrically coupled to power line b and output data indicating the identified current to the processor 599. The first switching control module 571a may suspend charging of power to the first battery 531 by opening the first charging prevention switch 571b in response to a charging suspension command received from the processor 599. The first switching control module 571a may suspend discharging of power from the first battery 531 to the first system 591 by opening the first discharging prevention switch 571c in response to a discharging suspension command received from the processor 599. In another embodiment, the first switching control module 571a may suspend charging or discharging of the first battery 531 according to a value of the current flowing through the line 571d without involvement of the processor 599.

The second protection circuit 572 (e.g., the battery protection circuit 240 of FIG. 2) may be configured to monitor the current output from the second battery 532 and/or the current introduced into the second battery 532, output a monitoring result to the processor 599, and prevent (or suspend) charging and/or discharging of the second battery 532 according to a control signal received from the processor 599. In an embodiment, the second protection circuit 572 may include a second switching module 572a, a second charging protection switch 572b, and a second discharging protection switch 572c. The components 572a, 572b, and 572c may perform functions identical to the functions of the above-described components 571a, 571b, and 571c.

The switching circuit 580 may configure a power adjustment mode during charging a battery (e.g., the first battery 531 and/or the second battery 532) as a first power adjustment mode (or an external adjustment mode) or a second power adjustment mode (or an internal adjustment mode) according to a control signal received from the processor 599. The first power adjustment mode may be a power adjustment mode for adjusting the voltage and/or the current by the power supply device 501 when charging the battery (e.g., the first battery 531 and/or the second battery 532), and outputting the adjusted voltage and/or current to the battery (e.g., the first battery 531 and/or the second battery 532). The second power adjustment mode may be a power adjustment mode for receiving power from the power supply device 501 by the charging circuit 550 when charging the battery (e.g., the first battery 531 and/or the second battery 532), adjusting the voltage and/or the current of the received power, and outputting the adjusted voltage and/or current to the battery (e.g., the first battery 531 and/or the second battery 532). In an embodiment, the switching circuit 580 may include an input terminal 581 connected to the positive power terminal 521, a first output terminal 582a connected to power line a, and a second output terminal 582b connected to a power input port (or a power input terminal) of the charging circuit 550. A power output port (or a power output terminal) of the charging circuit 550 may be connected to node b2 in power line b through power line h. The switching circuit 580 may connect the first output terminal 582a or the second output terminal 582b to the input terminal 581 according to a control signal received from the processor 599. In the first power adjustment mode (in a state in which the first output terminal 582a is connected to the input terminal 581), power supplied from the power supply device 501 may be output to the battery (e.g., the first battery 531 and/or the second battery 532) and the cell balancing circuit 540 through the first output terminal 582a. In the first power adjustment mode, a voltage input to the first battery 531 may be higher than that of the second battery 532, and accordingly, the first battery 531 can be charged faster than the second battery 532. In the second power adjustment mode (in a state in which the second output terminal 582b is connected to the input terminal 581), power supplied from the power supply device 501 may be transferred to the charging circuit 550 through the second output terminal 582b, and the voltage and/or the current of the power may be changed by the charging circuit 550 so as to be output to the battery (e.g., the first battery 531 and/or the second battery 532) and the cell balancing circuit 540. In the second power adjustment mode, a voltage input to the second battery 532 may be higher than that of the first battery 531, and accordingly, the second battery 532 can be charged faster than the first battery 531.

The processor 599 may include various processing circuitry and perform data communication with the power supply device 501 through a data terminal 523 of the connection terminal 520 to identify that the power supply device 501 is a model supporting a power adjustment mode (e.g., a PPS function). The processor 599 may configure a power adjustment mode as a first power adjustment mode or a second power adjustment mode according to the result of the identification. For example, when the power supply device 501 is identified as a model supporting the PPS function, the processor 599 may output, to the switching circuit 580, a control signal enabling connection of the first output terminal 582a to the input terminal 581 as the first power adjustment mode. When the power supply device 501 is identified as a model not supporting the PPS function, the processor 599 may output, to the switching circuit 580, a control signal enabling connection of the second output terminal 582b to the input terminal 581 as the second power adjustment mode.

While the batteries 531 and 532 are charged with the CV, the processor 599 may change the power adjustment mode from the first power adjustment mode to the second power adjustment mode. For example, a unit current value minutely adjusted by the charging circuit 550 at a time may be smaller than a unit current value minutely adjusted by the power supply device 501 at a time, the power supply device 501 supporting the PPS function. For example, the power supply device 501 is a model for adjusting the intensity of the current to be output, by 50 mA, but the charging circuit 550 may adjust the intensity of the current in smaller units (e.g., 10 mA) than 50 mA. Accordingly, when the intensity of the current is adjusted by the charging circuit 550, the batteries 531 and 532 can be charged to be comparatively close to full charge. When current I_SCVD output from the first output terminal 582a during the CV charging reaches a designated first reference value (e.g., 1 A) or decreases to a value smaller than the designated first reference value, the processor 599 may change the power adjustment mode from the first power adjustment mode to the second power adjustment mode. In a case in which the second system 592 is operated as a load consuming power during charging the batteries 531 and 532, when I_SCVD reaches a second reference value (e.g., 1.5 A) that is larger than the first reference value or decreases to a value smaller than the second reference value, the processor 599 may change the power adjustment mode from the first power adjustment mode to the second power adjustment mode so as to reduce charging times of the batteries 531 and 532.

According to an embodiment, in a state in which the power adjustment mode is configured as the first power adjustment mode, the processor 599 may perform operations below.

The processor 599 may perform the operations of identifying voltage V_battery (BAT)1 of the first battery 531 and voltage V_BAT2 of the second battery 532 through the monitoring circuits 561 and 562 and selecting one of the batteries 531 and 532 as a sensing object, the voltage of which is to be monitored. For example, in the first power adjustment mode, the processor 599 may first select the first battery 531 to which a relatively higher voltage is input. In another example, the processor 599 may first select a battery having a higher voltage from among the batteries.

When voltage V_sense (SNS) of the sensing object (e.g., the first battery 531 or the second battery 532) fails to reach target voltage V_float, the processor 599 may perform an operation of configuring a charging mode as a CC mode. For example, the processor 599 may control the power supply device 501 to constantly output I_SCVD at a value equal to or smaller than the designated maximum value, I_power adapter (PA)_MAX.

In the CC mode, the processor 599 may perform an operation of adjusting V_PA_MAX. For example, the first battery 531 may be fully charged and may be in a state electrically disconnected from the power supply device 501. If V_SNS (e.g., V_BAT2) is lower than V_flat (a first condition) in the disconnected state, the processor 599 may perform an operation of transmitting a control signal causing V_PA_MAX to increase by one step (e.g., 20 mV) to the power supply device 501. The operation may be repeatedly performed while the second battery 532 selected as a sensing object satisfies the first condition before being fully charged.

When V_SNS reaches V_float, the processor 599 may perform an operation of switching the charging mode from the CC mode to the CV mode. For example, the processor 599 may configure a voltage to be output from the power supply device 501 as the maximum output voltage value, V_PA_MAX, and sequentially decrease I_SCVD.

In the CV mode, the processor 599 may perform an operation of controlling the power supply device 501 to maintain V_SNS at V_float. For example, if V_SNS is equal to or higher than V_float (a second condition), the processor 599 may perform an operation of transmitting a control signal causing V_PA_MAX to decrease by one step (e.g., 20 mV) to the power supply device 501. The operation may be repeatedly performed while the battery (the first battery 531 or the second battery 532) selected as a sensing object satisfies the second condition before being fully charged.

According to an embodiment, in a state in which the power adjustment mode is configured as the second power adjustment mode, the processor 599 may perform operations below.

The processor 599 may identify V_BAT1 and V_BAT2 through the monitoring circuits 561 and 562 and select a battery having a higher voltage from among the batteries, as a sensing object, V_SNS.

When voltage V_SNS fails to reach V_float, the processor 599 may perform an operation of configuring a charging mode as a CC mode. For example, the processor 599 may control the charging circuit 550 to constantly output I_charger (CHGR) at a value equal to or smaller than the designated maximum value, I_CHGR_MAX.

In the CC mode, the processor 599 may perform an operation of adjusting V_CHGR_MAX. For example, the first battery 531 may be fully charged and may be in a state electrically disconnected from the charging circuit 550. If the first condition (V_SNS<V_flat) is satisfied in the disconnected state, the processor 599 may perform an operation of transmitting a control signal causing V_CHGR_MAX to increase by one step (e.g., 20 mV) to the charging circuit 550. The operation may be repeatedly performed while the second battery 532 selected as a sensing object satisfies the first condition before being fully charged. According to an embodiment, when the operation of increasing V_CHGR_MAX is repeatedly performed as the first condition (V_SNS<V_float) is satisfied, V_CHGR_MAX may increase by a fixed value (e.g., 20 mV) or V_CHGR_MAX may increase by a variable value (e.g., a first value when V_CHGR_MAX is equal to or larger than a first threshold value, or a second value when V_CHGR_MAX is smaller than the first threshold value, wherein the second value is larger than the first value).

When V_SNS reaches V_float, the processor 599 may switch the charging mode from the CC mode to the CV mode. For example, the processor 599 may configure voltage V_CHGR (e.g., V_system (SYS) of FIG. 5) output from the charging circuit 550 as the maximum output voltage value, V_CHGR_MAX, and sequentially reduce I_CHGR.

In the CV mode, the processor 599 may perform an operation of controlling the charging circuit 550 to maintain V_SNS at V_float. For example, if the second condition (V_SNS>V_float) is satisfied, the processor 599 may perform an operation of transmitting a control signal causing V_CHGR_MAX to decrease by one step (e.g., 20 mV) to the charging circuit 550. The operation may be repeatedly performed while the battery selected as a sensing object satisfies the second condition before being fully charged. According to an embodiment, when the operation of decreasing V_CHGR_MAX is repeatedly performed as the second condition (V_SNS≥ V_float) is satisfied, V_CHGR_MAX may decrease by a fixed value (e.g., 20 mV) or V_CHGR_MAX may decrease by a variable value (e.g., a first value when V_CHGR_MAX is equal to or larger than a first threshold value, or a second value when V_CHGR_MAX is smaller than the first threshold value, wherein the second value is smaller than the first value).

After the operation of adjusting (decreasing or increasing) the maximum output voltage value (V_PA_MAX or V_CHGR_MAX) is performed, a battery having a higher voltage may change. Accordingly, a sensing object may change. For example, in a case of V_BAT2>V_BAT1 before the adjustment operation, the processor 599 configure V_BAT2 as V_SNS, and in a case of V_BAT2<V_BAT1 after the adjustment operation, the processor 599 may configure V_BAT1 as V_SNS.

When the battery selected as the sensing object is fully charged, the processor 599 may perform an operation of electrically disconnecting the fully charged battery from a power source (e.g., the power supply device 501 or the charging circuit 550) so as to prevent and/or mitigate the fully charged battery from being charged any longer. For example, when the fully charged battery corresponds to the first battery 531, the processor 599 may control the first switching control module 571*a* to open the first charging prevention switch 571*b*. The processor 599 may perform an operation of configuring another battery (e.g., the second battery 532) as a new sensing object, the voltage of which is to be monitored, and adjusting the maximum output voltage value (e.g., V_PA_MAX or V_CHGR_MAX) as described above until the newly configured sensing object is fully charged.

Figure 6A:
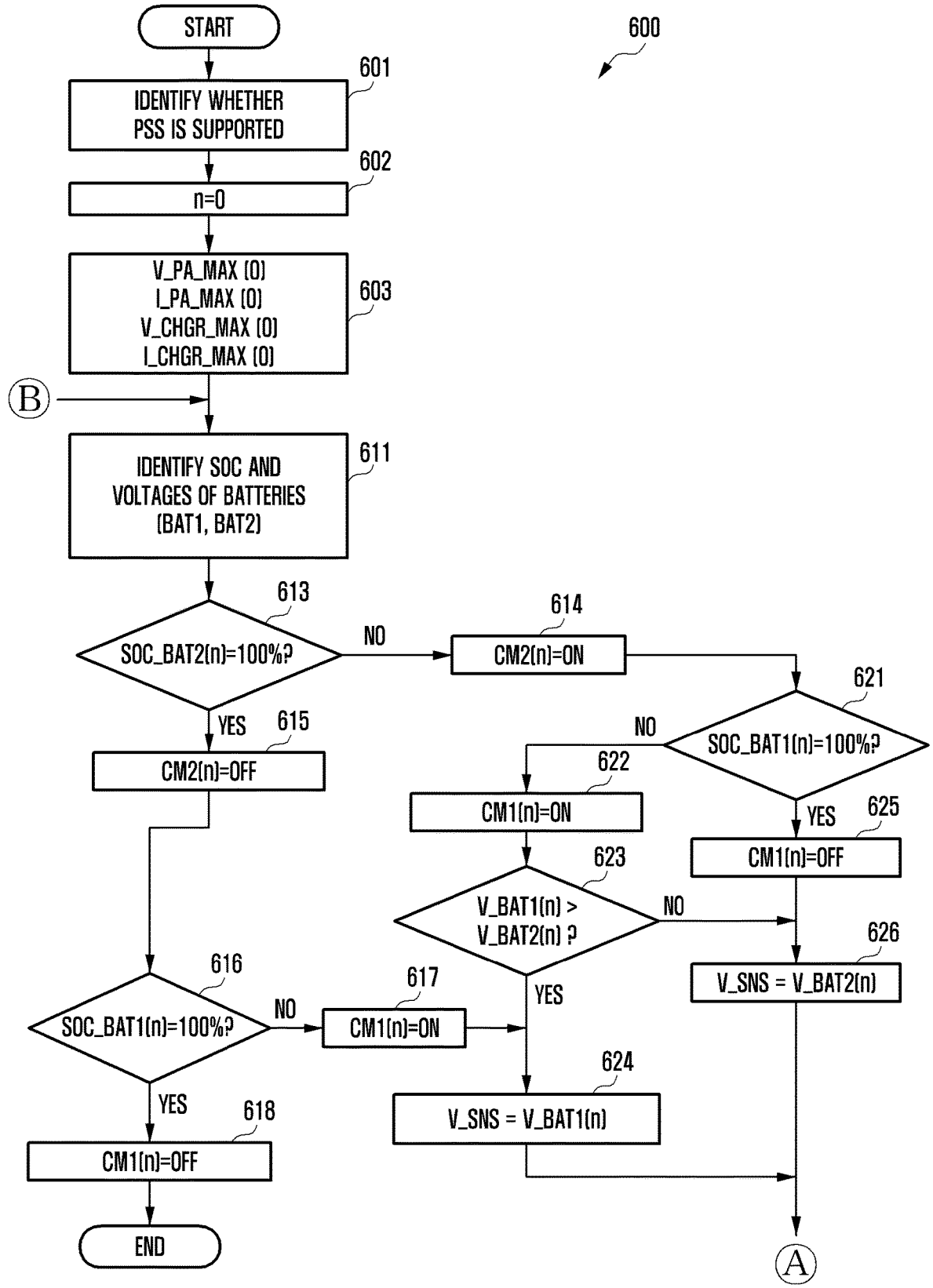
FIGS. 6A and 6B are flowcharts illustrating example operations for charging batteries according to various embodiments.
Figure 6B:
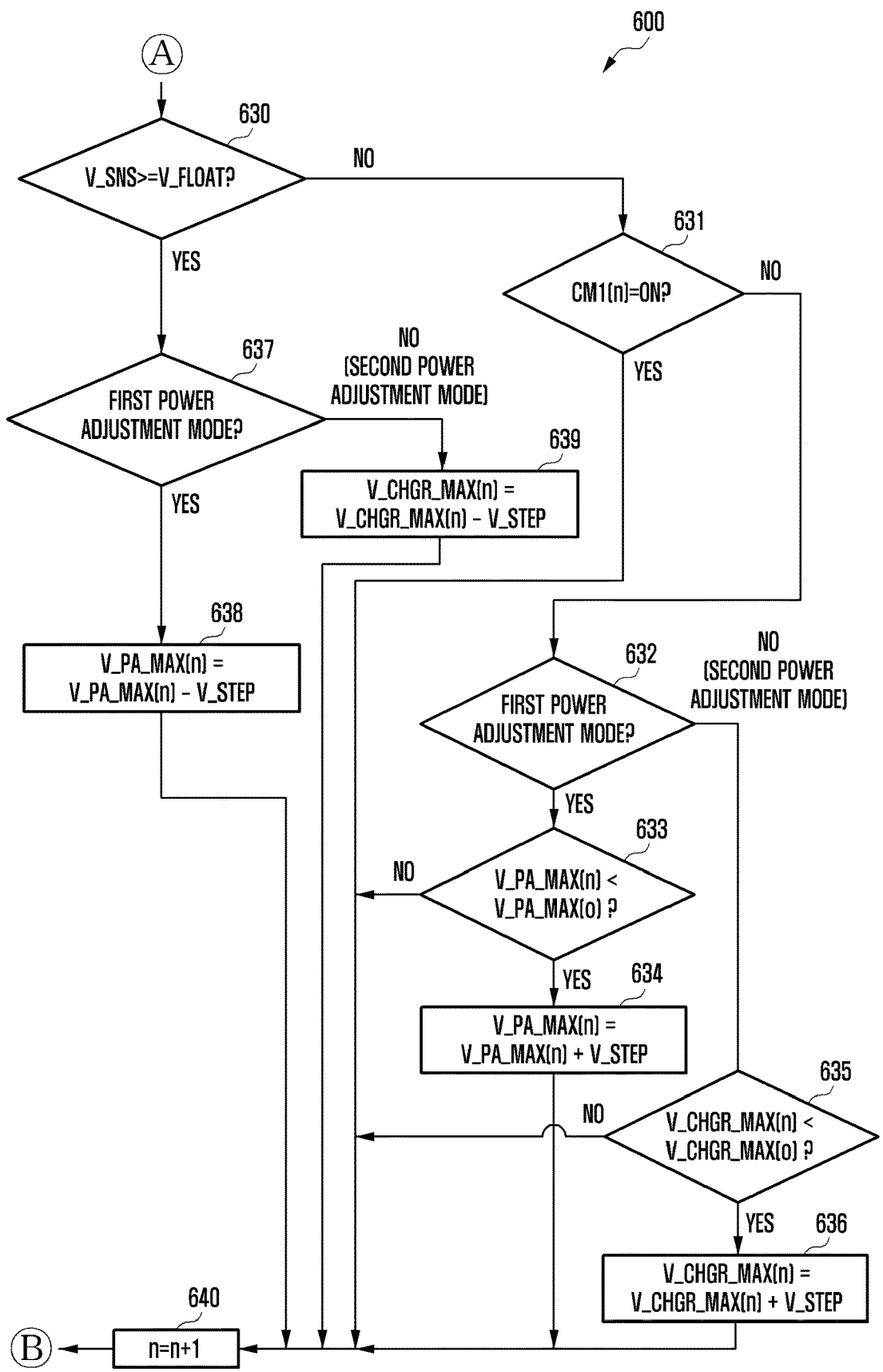

FIGS. 6A and 6B are flowcharts illustrating example operations 600 for charging batteries 531 and 532 according to various embodiments. In an embodiment, the operations 600 may be performed by the processor 599 while the electronic device 502 charges the batteries 531 and 532 using power received from the power supply device 501. In an embodiment, a memory (e.g., the memory 130 of FIG. 1) may store instructions which, when executed, cause the processor 599 to perform the operations 600.

In operation 601, the processor 599 may perform data communication with the power supply device 501 through the data terminal 523 of the connection terminal 520 to identify whether the power supply device 501 corresponds to a model supporting a PPS function. In operation 602, the processor 599 may configure number n as "0". In operation 603, the processor 599 may configure each of V_PA_MAX, I_PA_MAX, V_CHGR_MAX, and I_CHGR_MAX with an initial value corresponding to number "0". Here, number n may be used as information indicting the number of times of adjusting the maximum output voltage value (V_PA_MAX or V_CHGR_MAX).

The processor 599 may perform operation 611 of identifying SOC_BAT1 corresponding to a state of charge of the first battery 531 through the first monitoring circuit 561 and identifying SOC_BAT2 corresponding to a state of charge of the second battery 532 through the second monitoring circuit 562. In addition, in operation 611, the processor 599 may identify V_BAT1 and V_BAT2 through the monitoring circuits 561 and 562. The processor 599 may perform operation 613 of determining whether SOC_BAT2 is in a full charge state. For example, in operation 613, the processor 599 may determine whether a charged amount (e.g., SOC_BAT2) of the second battery 532 reaches a configured maximum capacity according to the monitoring result (data indicating the current value) received from the first protection circuit 571. If the determination result in operation 613 shows that SOC_BAT2 does not correspond to a full charge state, the processor 599 may configure the second charging prevention switch 572b (hereinafter, referred to as charging MOSFET (CM)2) as an ON state (a closed state) in operation 614. If the determination result in operation 613 shows that SOC_BAT2 corresponds to a full charge state, the processor 599 may perform operation 615 of configuring CM2 as an OFF state (an open state) to prevent the second battery 532 from being over charged. After performing operation 615, the processor 599 may perform operation 616 of determining whether SOC_BAT1 corresponds to a full charge state (e.g., 100% charged). If the determination result in operation 616 shows that SOC_BAT1 does not correspond to a full charge state, the processor 599 may configure the first charging prevention switch 571b (hereinafter, referred to as CM1) as an ON state (a closed state) in operation 617. If the determination result in operation 616 shows that SCO_BAT1 corresponds to a full charge state, the processor 599 may terminate battery charging by performing operation 618 of configuring CM1 as an OFF state (an open state) to prevent the first battery 531 from being over charged.

After performing operation 614, the processor 599 may perform operation 621 of determining whether SOC_BAT1 corresponds to a full charge state (100% charged). If the determination result in operation 621 shows that SOC_BAT1 does not corresponds to a full charge state, the processor 599 may configure CM1 as an ON state in operation 622. After performing operation 622, the processor 599 may perform operation 623 of determining one having a larger value among V_BAT1 and V_BAT2. If a condition "V_BAT1>V_BAT2" is satisfied according to the determination result in operation 623, the processor 599 may perform operation 624 of configuring V_SNS as V_BAT1. Alternatively, according to performing of operation 617 upon the determination result in operation 616, the processor 599 may perform operation 624 of configuring V_SNS as V_BAT1.

If the determination result in operation 621 shows that SOC_BAT1 corresponds to a full charge state, the processor 599 may perform operation 625 of configuring CM1 as an OFF state.

If a condition "V_BAT1>V_BAT2" is not satisfied (that is, "V_BAT1≤V_BAT2" is satisfied) according to the determination result in operation 623, the processor 599 may perform operation 626 of configuring V_SNS as V_BAT2. Alternatively, according to performing of operation 625 upon the determination result in operation 621, the processor 599 may perform operation 626 of configuring V_SNS as V_BAT2.

After performing operation 624 or operation 626, the processor 599 may determine whether a first condition (V_SNS≥V_float) is satisfied in operation 630.

If the determination result in operation 630 shows that the first condition is not satisfied (that is, a second condition (V_SNS<V_float) is satisfied), the processor 599 may perform operation 631 of determining whether CM1 is in an ON state. If the determination result in operation 631 shows that CM1 is in the ON state, the processor 599 may maintain a configuration value for charging (e.g., V_PA_MAX or V_CHGR_MAX) as a currently configured value and perform operation 640 of configuring n as n+1.

If the determination result in operation 631 shows that CM1 is in an OFF state (e.g., CM1 is in an OFF state as the first battery 531 is fully charged), the processor 599 may perform operation 632 of determining whether a power adjustment mode is a first power adjustment mode or a second power adjustment mode. If the determination result in operation 632 shows that the power adjustment mode is configured as the first power adjustment mode, the processor 599 may perform operation 633 of determining whether V_PA_MAX is smaller than the initial value (V_PA_MAX (0)). If the determination result in operation 633 shows that V_PA_MAX is smaller than the initial value, the processor 599 may perform operation 634 of increasing V_PA_MAX by one step (V_STEP) (e.g., 20 mV). If the determination result in operation 633 shows that V_PA_MAX is equal to or larger than the initial value (for example, V_PA_MAX is equal to the initial value), the processor 599 may maintain a configuration value for charging as a currently configured value and perform operation 640. If the determination result in operation 632 shows that the power adjustment mode is configured as the second power adjustment mode, the processor 599 may perform 635 of determining whether V_CHGR_MAX is smaller than the initial value (V_CHGR_MAX (0)). If the determination result in operation 635 shows that V_CHGR_MAX is smaller than the initial value, the processor 599 may perform operation 636 of increasing V_CHGR_MAX by one step (V_STEP) (e.g., 20 mV). If the determination result in operation 635 shows that V_CHGR_MAX is equal to or larger than the initial value (for example, V_CHGR_MAX is equal to the initial value), the processor 599 may maintain a configuration value for charging as a currently configured value and perform operation 640.

If the determination result in operation 630 shows that the first condition (V_SNS>V_float) is satisfied, the processor 599 may perform operation 637 of determining whether the power adjustment mode corresponds to either the first power adjustment mode or the second power adjustment mode. If the determination result in operation 637 shows that the power adjustment mode is configured as the first power adjustment mode, the processor 599 may perform operation 638 of decreasing V_PA_MAX by one step (V_STEP) (e.g., 20 mV). The processor 599 may sequentially perform operation 638 and operation 640. If the determination result in operation 637 shows that the power adjustment mode is configured as the second power adjustment mode, the processor 599 may perform operation 639 of decreasing V_CHGR_MAX by one step (V_STEP) (e.g., 20 mV). The processor 599 may sequentially perform operation 639 and operation 640.

After performing operation 640, the processor 599 may return to operation 611 in operations 600.

According to an embodiment, the charged amount (e.g., SOC_BAT2) of the second battery 532 is identified in operation 613 among operations 600 for charging the batteries 531 and 532, but according to another embodiment, operations for charging the batteries may be performed according to the charged amount (e.g., SOC_BAT1) of the first battery 531.

Figure 7:
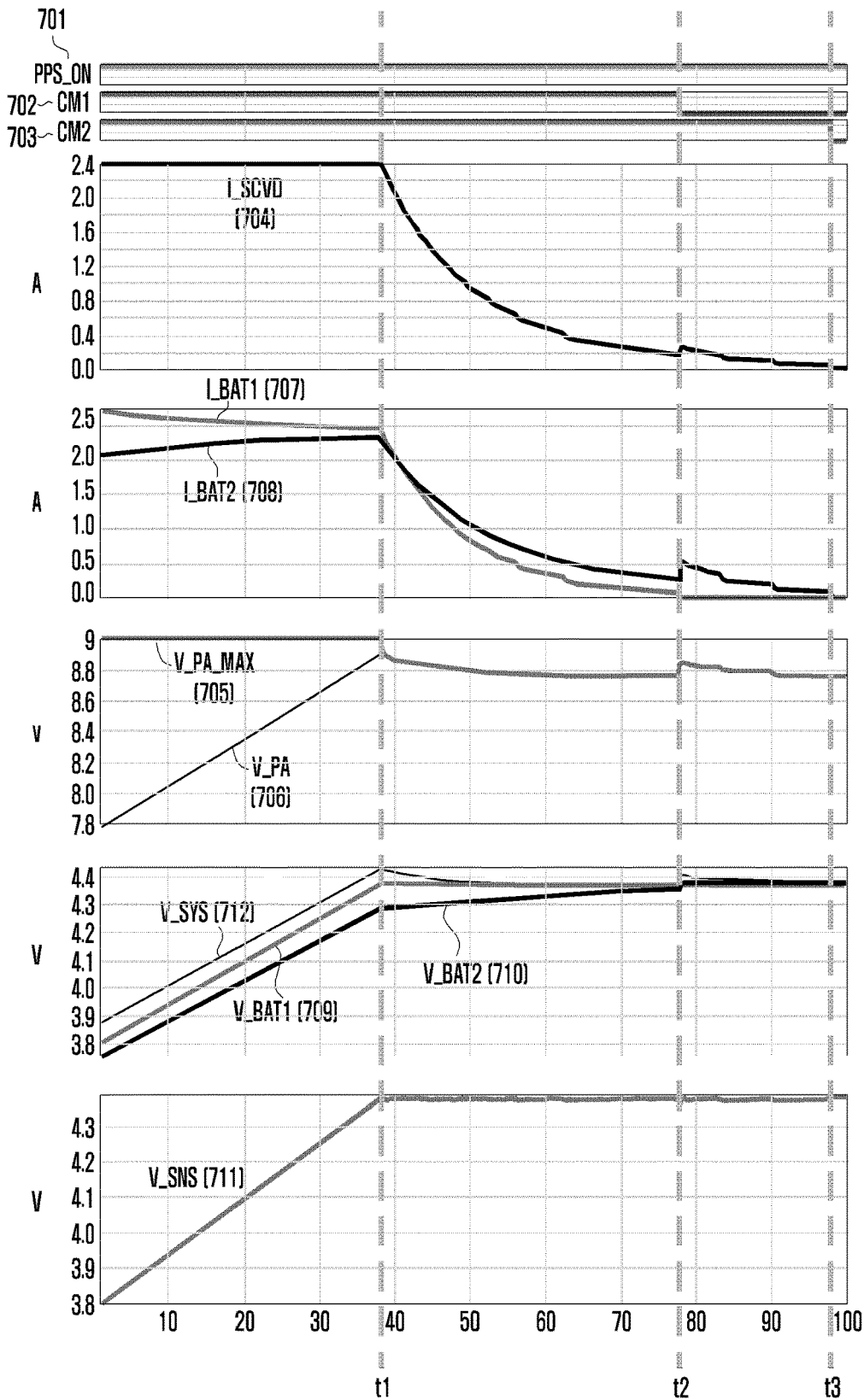
FIG. 7 includes various graphs illustrating example voltage and current waveforms indicating a situation in which the electronic device of FIG. 5 charges batteries using a power supply device according to various embodiments.

FIG. 7 includes graphs illustrating example voltage and current waveforms indicating a situation in which the electronic device 502 of FIG. 5 charges batteries 531 and 532 using the power supply device 501 according to various embodiments. In FIG. 7, a vertical axis (Y axis) indicates a numerical value of each waveform, and a horizontal axis (X axis) indicates a time axis. A first waveform 701 indicates that a power adjustment mode of the electronic device 502 is configured as a first power adjustment mode. A second waveform 702 indicates the state of CM1. A third waveform 703 indicates the state of CM2. A fourth waveform 704 indicates I_SCVD. For example, the processor 599 may control the power supply device 501 to constantly output I_SCVD at I_PA_MAX (e.g., 2.4A) during the CC mode (for example, O to time point t1 in the time axis). A fifth waveform 705 indicates V_PA_MAX. A sixth waveform 706 indicates voltage V_PA output from the power supply device 501. The processor 599 may control the power supply device 501 so that V_PA does not exceed V_PA_MAX. For example, the processor 599 may control the power supply device 501 to output V_PA at V_PA_MAX during the CV mode (for example, after time point t1 in the time axis). A seventh waveform 707 indicates current I_BAT1 output from the first battery 531 when I_SCVD output from the power supply device 501 corresponds to the fourth waveform 704. An eighth waveform 708 indicates current I_BAT2 output from the second battery 532 when I_SCVD output from the power supply device 501 corresponds to the fourth waveform 704. A ninth waveform 709 indicates voltage V_BAT1 of the first battery 531 when V_PA output from the power supply device 501 corresponds to the sixth waveform 706. A tenth waveform 710 indicates voltage V_BAT2 of the second battery 532 when V_PA output from the power supply device 501 corresponds to the sixth waveform 706. An eleventh waveform 711 indicates voltage V_SNS of a battery selected as a sensing object. A twelfth waveform 712 indicates voltage V_SYS (e.g., V_SYS of FIG. 5) input to the systems 591 and 592.

Referring to FIG. 7, the processor 599 may configure V_BAT1 corresponding to a relatively higher voltage among V_BAT1 and V_BAT2 as V_SNS. As the charging is performed in the CC mode, V_SNS (e.g., V_BAT1) gradually increases and V_SNS (e.g., V_BAT1) may reach V_float (e.g., approx. 4.4V) at time point t1. Accordingly, when V_SNS (e.g., V_BAT1) reaches V_float, the processor 599 may switch the charging mode into a CV mode. For example, the processor 599 may decrease V_PA_MAX to maintain V_SNS (e.g., V_BAT1) at V_float. For example, the processor 599 may sequentially decrease (for example, decrease at designated intervals (e.g., 20 mV)) V_PA_MAX from 9V to 8.8V after switching from the CC mode into the CV mode. At time point t2, the processor 599 recognizes from the monitoring result received from the first protection circuit 571 that the current output from the first battery 531 has a value equal to or smaller than a reference value (that is, the first battery 531 is fully charged), and accordingly, the processor 599 may terminate the charging of the first battery 531 by switching CM1 into the OFF state and configure V_BAT2 as V_SNS. While completing the charging of the first battery 531 and charging the second battery 532, the processor 599 may recognize that V_SNS (e.g., V_BAT2) is less than V_float. For example, at time point t2, when V_SNS (e.g., V_BAT2) is less than V_float, the processor 599 may increase V_PA_MAX by one step (V_STEP) (e.g., 20 mV). At time point t3, the processor 599 may recognize that the second battery 532 is fully charged, and accordingly, the processor 599 may terminate the charging of the second battery 532 by switching CM2 into the OFF state.

Figure 8:
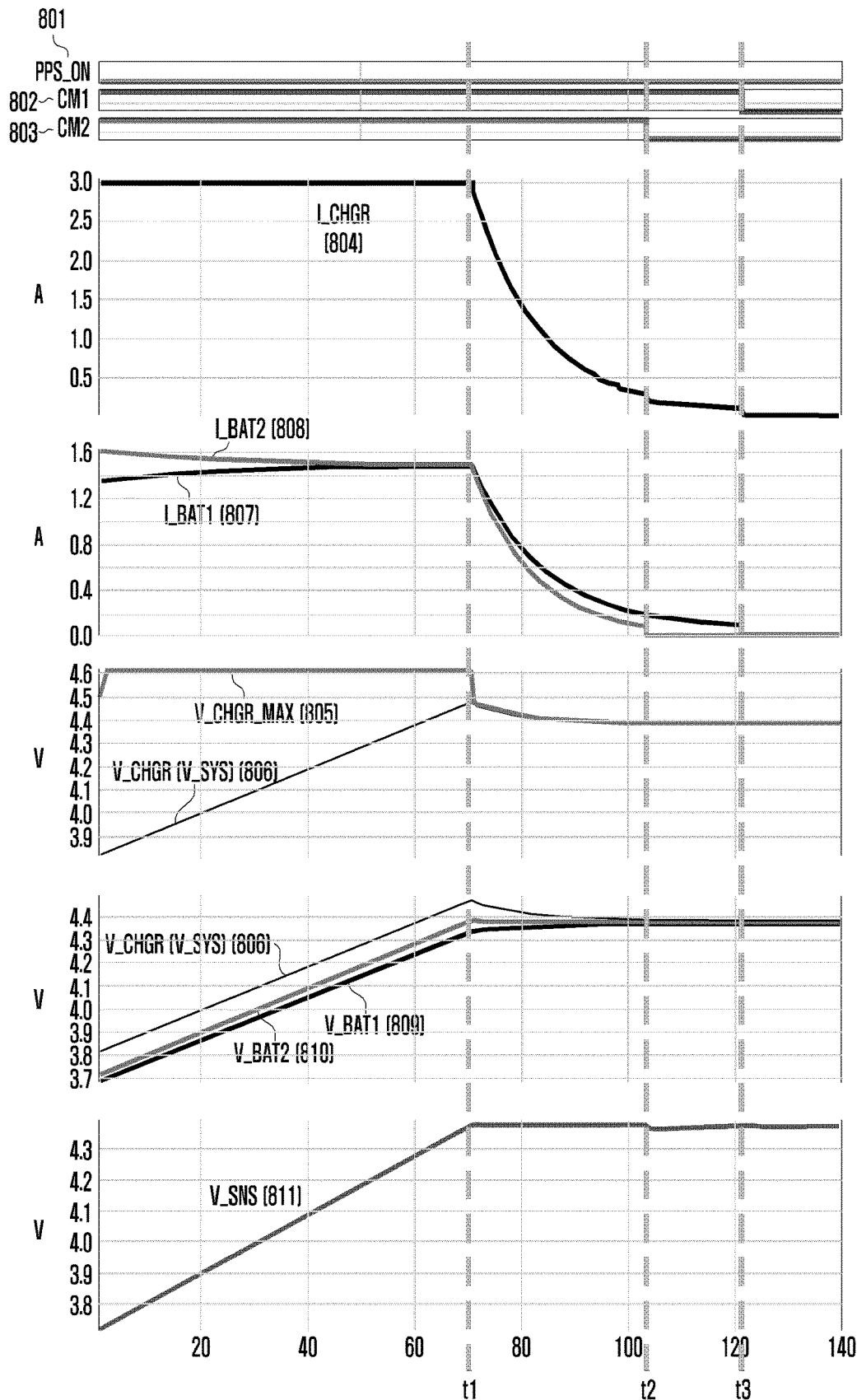
FIG. 8 includes various graphs illustrating example voltage and current waveforms indicating a situation in which the electronic device of FIG. 5 charges batteries using a charging circuit according to various embodiments.

FIG. 8 includes graphs illustrating example voltage and current waveforms indicating a situation in which the electronic device 502 of FIG. 5 charges batteries 531 and 532 using the charging circuit 550 according to various embodiments. In FIG. 8, a vertical axis indicates a numerical value of each waveform, and a horizontal axis indicates a time axis. A first waveform 801 indicates that a power adjustment mode of the electronic device 502 is configured as a second power adjustment mode. A second waveform 802 indicates the state of CM1. A third waveform 803 indicates the state of CM2. A fourth waveform 804 indicates I_CHGR. For example, the processor 599 may control the charging circuit 550 to constantly output I_CHGR at I_CHGR_MAX (e.g., 3A) during the CC mode (for example, O to time point t1 in the time axis). A fifth waveform 805 indicates V_CHGR_MAX. A sixth waveform 806 indicates voltage V_CHGR (V_SYS) output from the charging circuit 550. The processor 599 may control the charging circuit 550 so that V_CHGR does not exceed V_CHGR_MAX. For example, the processor 599 may control the charging circuit 550 to output V_CHGR at V_CHGR_MAX during the CV mode (for example, after time point t1 in the time axis). A seventh waveform 807 indicates current I_BAT1 output from the first battery 531 when I_CHGR output from the charging circuit 550 corresponds to the fourth waveform 804. An eighth waveform 808 indicates current I_BAT2 output from the second battery 532 when I_CHGR output from the charging circuit 550 corresponds to the fourth waveform 804. A ninth waveform 809 indicates voltage V_BAT1 of the first battery 531 when V_CHGR output from the charging circuit 550 corresponds to the sixth waveform 806. A tenth waveform 810 indicates voltage V_BAT2 of the second battery 532 when V_CHGR output from the charging circuit 550 corresponds to the sixth waveform 806. An eleventh waveform 811 indicates voltage V_SNS of a battery (for example, the first battery 531 or the second battery 532) selected as a sensing object.

Referring to FIG. 8, V_BAT2 may be higher than V_BAT1 while the battery is charged in the second power adjustment mode, and accordingly, the processor 599 may configure V_BAT2 as V_SNS. As the charging is performed in the CC mode, V_SNS (e.g., V_BAT2) gradually increases and V_SNS (e.g., V_BAT2) may reach V_float (e.g., approx. 4.4V) at time point t1. Accordingly, when V_SNS (e.g., V_BAT2) reaches V_float, the processor 599 may switch the charging mode into a CV mode. For example, the processor 599 may decrease V_CHGR_MAX to maintain V_SNS (e.g., V_BAT2) at V_float. For example, after the mode switching, the processor 599 may sequentially decrease (for example, decrease at designated intervals (e.g., 20 mV)) V_CHGR_MAX from 4.6V to 4.4V and maintain V_CHGR_MAX at 4.4V. At time point t2, the processor 599 recognizes that the second battery 532 is fully charged, and accordingly, the processor 599 may terminate the charging of the second battery 532 by switching CM2 into the OFF state and configure V_BAT1 as V_SNS. At time point t3, the processor 599 may recognize that the first battery 531 is fully charged, and accordingly, the processor 599 may terminate the charging of the first battery 531 by switching CM1 into the OFF state.

Comparing FIG. 7 and FIG. 8, the first battery 531 may be fully charged earlier than the second battery 532 in the first power adjustment mode. The second battery 532 may be fully charged earlier than the first battery 531 in the second power adjustment mode. Accordingly, when the charging capacity of the first battery 531 is smaller than that of the second battery 532, the processor 599 may select the first power adjustment mode as a power adjustment mode for battery charging. When the charging capacity of the second battery 532 is smaller than that of the first battery 531, the processor 599 may select the second power adjustment mode as a power adjustment mode for battery charging. Comparing time point t3 of FIG. 7 and time point t3 of FIG. 8, a time taken to fully charge both batteries 531 and 532 may be shorter in the first power adjustment mode as compared to the second power adjustment mode. Accordingly, in order to promptly complete the charging, the processor 599 may select the first power adjustment mode as a power adjustment mode for battery charging.

Figure 9:
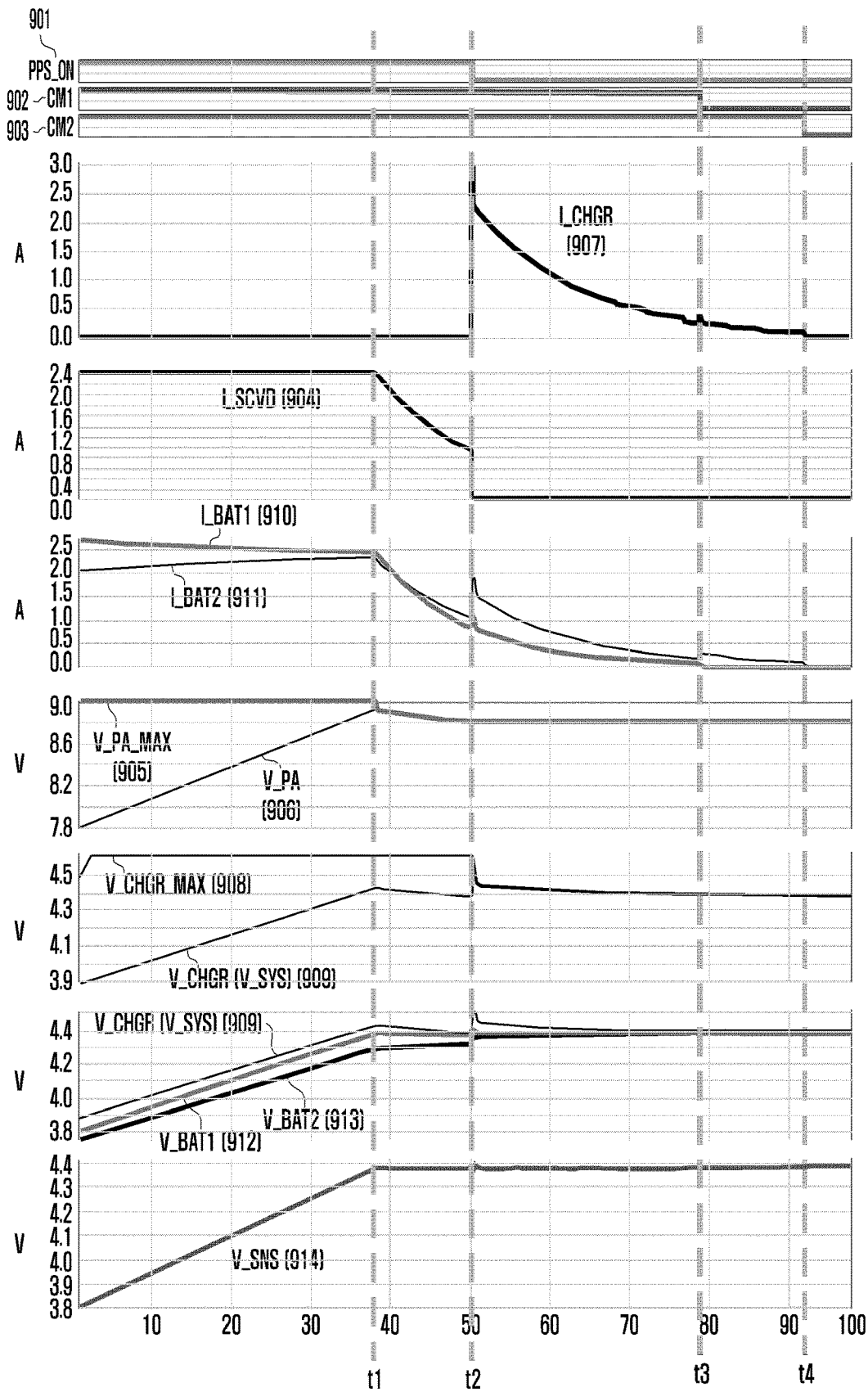
FIG. 9 includes various graphs illustrating example voltage and current waveforms indicating a situation in which the electronic device of FIG. 5 charges batteries using a power supply device and a charging circuit according to various embodiments.

FIG. 9 includes graphs illustrating example voltage and current waveforms indicating a situation in which the electronic device 502 of FIG. 5 charges batteries 531 and 532 using the power supply device 501 and the charging circuit 550 according to various embodiments. The description in FIG. 9 which is duplicated with those in FIGS. 7 and 8 may not be repeated or may be simply made. A first waveform 901 indicates that a power adjustment mode of the electronic device 502 is changed from a first power adjustment mode to a second power adjustment mode at time point t2. A second waveform 902 indicates the state of CM1. A third waveform 903 indicates the state of CM2. A fourth waveform 904 indicates I_SCVD. A fifth waveform 905 indicates V_PA_MAX. A sixth waveform 906 indicates V_PA. A seventh waveform 907 indicates I_CHGR. An eighth waveform 908 indicates V_CHGR_MAX. A ninth waveform 909 indicates V_CHGR (V_SYS). A tenth waveform 910 indicates I_BAT1 when I_SCVD corresponds to the fourth waveform 904 and an eleventh waveform 911 indicates I_BAT2 when I_CHGR indicates the seventh waveform 907. A twelfth waveform 912 indicates V_BAT1 when V_PA corresponds to the sixth waveform 906 and a thirteenth waveform 913 indicates V_BAT2 when V_CHGR corresponds to the ninth waveform 909. A fourteenth waveform 914 indicates voltage V_SYS of a battery (for example, the first battery 531 or the second battery 532) selected as a sensing object.

Referring to FIG. 9, V_BAT1 may be higher than V_BAT2 while the battery is charged in the first power adjustment mode, and accordingly, the processor 599 may configure V_BAT1 as V_SNS. In the first power adjustment mode, a higher voltage can be input to the first battery 531 compared to the second battery 532, and accordingly, the first battery 531 may be charged relatively faster than the second battery 532. As the charging is performed in the CC mode (for example, 0 to time point t1 in the time axis), V_SNS (e.g., V_BAT1) gradually increases and V_SNS (e.g., V_BAT1) may reach V_float (e.g., approx. 4.4V) at time point t1. Accordingly, when V_SNS (e.g., V_BAT1) reaches V_float, the processor 599 may switch the charging mode into a CV mode (for example, after time point t1 in the time axis). As the charging is performed in the CV mode, I_SCVD gradually decreases and, at time point t2, reaches a first reference value (e.g., 1 A) which is a reference for switching the power adjustment mode from the first power adjustment mode to the second power adjustment mode. That is, at time point t2, when I_SCVD reaches the first reference value, the processor 599 may change the power adjustment mode from the first power adjustment mode to the second power adjustment mode. According to the switching from the first power adjustment mode to the second power adjustment mode, the charging circuit 550 may output I_CHGR at I_CHGR_MAX (e.g., 3A). I_CHGR may be higher than the reference value, and accordingly, I_BAT1 and I_BAT2 may instantaneously increase at time point t2. The increase may cause V_SNS (e.g., V_BAT1) to increase to the level beyond V_float. Accordingly, the processor 599 may sequentially decrease (for example, decrease at designated intervals (e.g., 20 mV)) V_CHGR_MAX to, for example, from 4.6V to 4.4V, so as to maintain V_SNS (e.g., V_BAT1) at V_float. The resistance of a line extended from the charging circuit 550 to the first battery 531 may be lower than the resistance of a line extended from the charging circuit 550 to the second battery 532, and accordingly, I_BAT2 may further increase compared to I_BAT1. Accordingly, in the second power adjustment mode, the second battery 532 may be charged relatively faster than the first battery 531. At time point t3, the processor 599 recognizes that the first battery 531 is fully charged, and accordingly, the processor 599 may switch CM1 into the OFF state and configure V_BAT2 as V_SNS. At time point t4, the processor 599 recognizes that the second battery 532 is fully charged, and accordingly, the processor 599 may switch CM2 into the OFF state.

Comparing time point t3 in FIG. 7 and time point t4 in FIG. 9, the processor 599 may more promptly complete charging of the batteries 531 and 532 by switching the power adjustment mode from the first power adjustment mode into the second power adjustment mode while the charging is performed in the CV mode.

Figure 10:
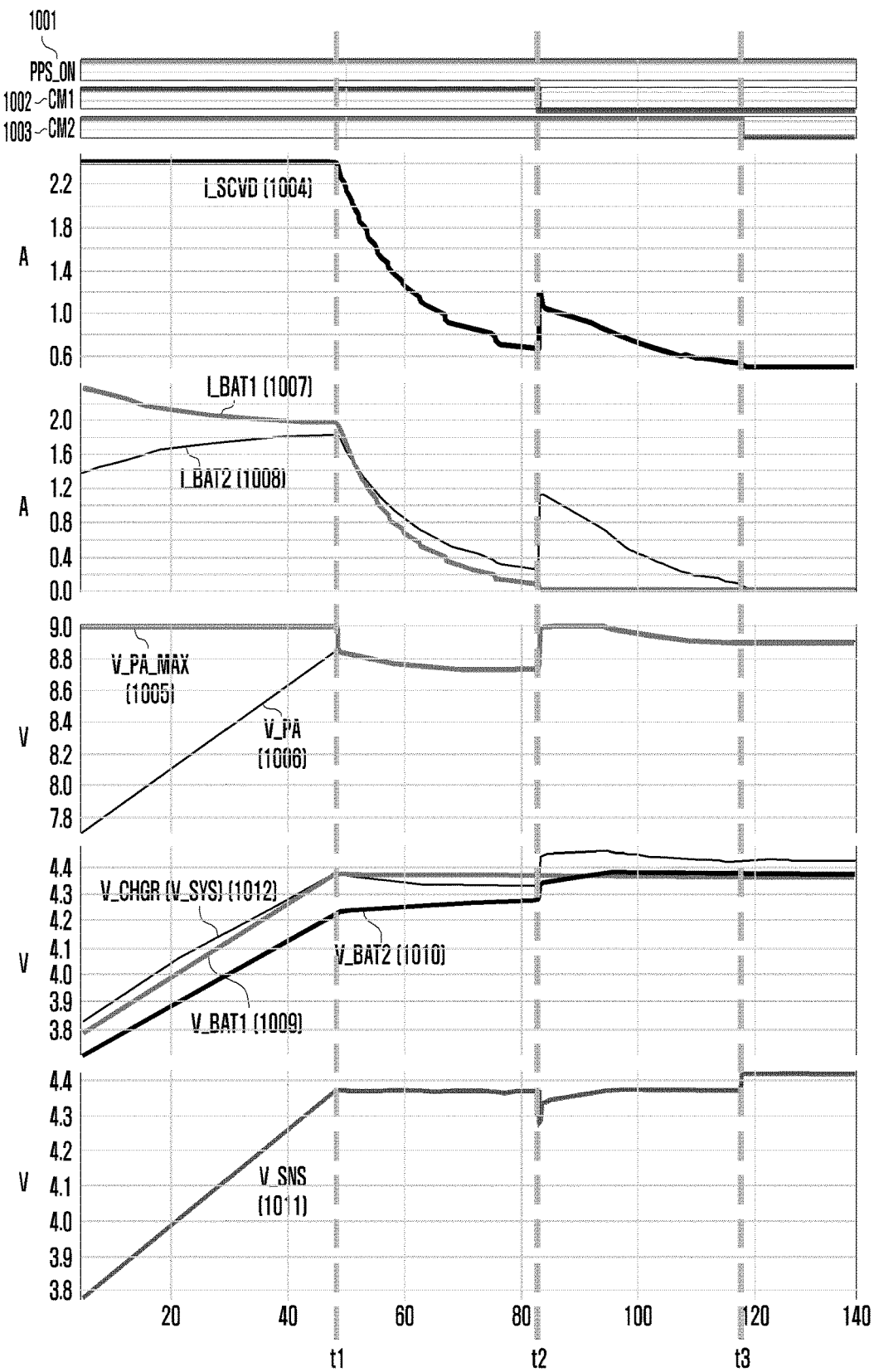
FIG. 10 includes various graphs illustrating example voltage and current waveforms indicating a situation in which the electronic device of FIG. 5 charges batteries using a power supply device while using power according to various embodiments.

FIG. 10 includes graphs illustrating example voltage and current waveforms indicating a situation in which the electronic device 502 of FIG. 5 charges batteries 531 and 532 using the power supply device 501 while using power according to various embodiments. The description in FIG. 10 which is duplicated with those in FIGS. 7, 8 and 9 may not be repeated or may be simply made. A first waveform 1001 indicates that a power adjustment mode of the electronic device 502 is configured as a first power adjustment mode. A second waveform 1002 indicates the state of CM1. A third waveform 1003 indicates the state of CM2. A fourth waveform 1004 indicates I_SCVD. A fifth waveform 1005 indicates V_PA_MAX. A sixth waveform 1006 indicates V_PA. A seventh waveform 1007 indicates I_BAT1 when I_SCVD corresponds to the fourth waveform 1004. An eighth waveform 1008 indicates I_BAT2 when I_SCVD corresponds to the fourth waveform 1004. A ninth waveform 1009 indicates V_BAT1 when V_PA corresponds to the sixth waveform 1006. A tenth waveform 1010 indicates voltage V_BAT2 of the second battery 532 when V_PA corresponds to the sixth waveform 1006. An eleventh waveform 1011 indicates V_SNS. A twelfth waveform 1012 indicates V_SYS.

Referring to FIG. 10, V_BAT1 may be higher than V_BAT2 while the battery is charged in the first power adjustment mode, and accordingly, the processor 599 may configure V_BAT1 as V_SNS. As the charging is performed in the CC mode, V_SNS (e.g., V_BAT1) gradually increases and V_SNS (e.g., V_BAT1) may reach V_float (e.g., approx. 4.4V) at time point t1. Accordingly, when V_SNS (e.g., V_BAT1) reaches V_float, the processor 599 may switch the charging mode into a CV mode. The second system 592 may function as a load consuming power while two batteries 531 and 532 are charged. For example, a current flowing through power line b may be divided into two parts, wherein the current in one part is provided to the second battery 532 to accumulate charge in the second battery 532, and the current (e.g., 1A current) in the other part is provided to the second system 592 to be used for energy consumption (e.g., to be used to display an image, output a sound, or wirelessly transmit data). Accordingly, V_BAT2 may increase slower than V_BAT2 of FIG. 7. At time point t2, the processor 599 recognizes that the first battery 531 is fully charged, and accordingly, the processor 599 may terminate the charging of the first battery 531 by switching CM1 into the OFF state and configure V_BAT2 as V_SNS. The processor 599 recognizes that V_SNS (e.g., V_BAT2) fails to reach V_float, and accordingly, the processor 599 may increase V_PA_MAX (V_PA) to an initially configured maximum voltage value (e.g., 9V) in order to more promptly complete the charging of the second battery 532. As V_PA increases, I_BAT2 may rapidly increase. Thereafter, as V_PA is limited to V_PA_MAX, I_BAT2 may gradually decrease. At time point t3, the processor 599 may recognize that the second battery 532 is fully charged, and accordingly, the processor 599 may terminate the charging of the second battery 532 by switching CM2 into the OFF state.

Figure 11:
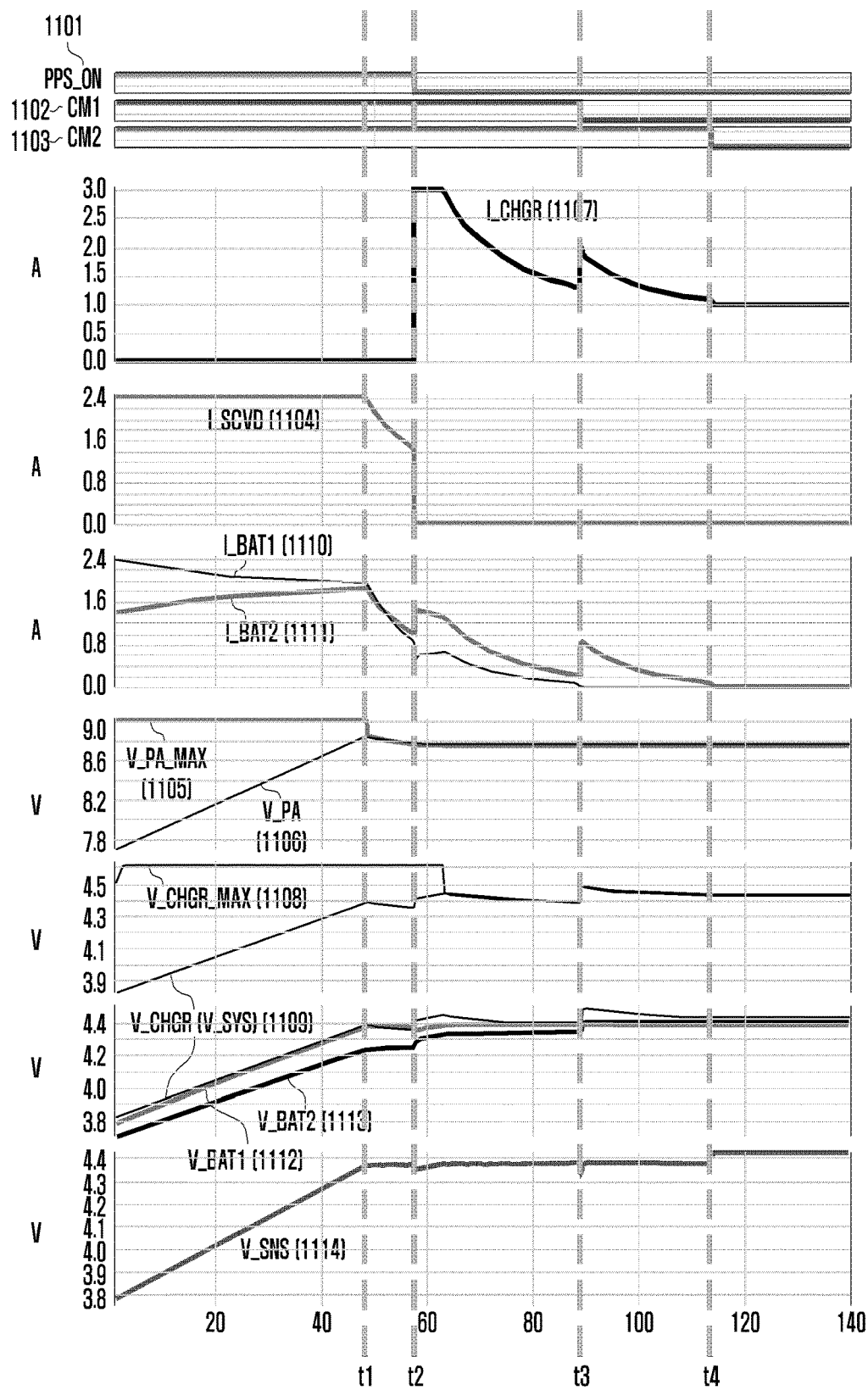
FIG. 11 includes various graphs illustrating example voltage and current waveforms indicating a situation in which the electronic device of FIG. 5 charges batteries using a power supply device and a charging circuit while using power according to various embodiments.

FIG. 11 includes graphs illustrating example voltage and current waveforms indicating a situation in which the electronic device 502 of FIG. 5 charges batteries 531 and 532 using the power supply device 501 and the charging circuit 550 according to various embodiments. The description in FIG. 11 which is duplicated with those in FIGS. 7, 8, 9 and 10 may not be repeated or may be simply made. A first waveform 1101 indicates that a power adjustment mode of the electronic device 502 is changed from a first power adjustment mode to a second power adjustment mode. A second waveform 1102 indicates the state of CM1. A third waveform 1103 indicates the state of CM2. A fourth waveform 1104 indicates I_SCVD. A fifth waveform 1105 indicates V_PA_MAX. A sixth waveform 1106 indicates V_PA. A seventh waveform 1107 indicates I_CHGR. An eighth waveform 1108 indicates V_CHGR_MAX. A ninth waveform 1109 indicates V_CHGR (V_SYS). A tenth waveform 1110 indicates I_BAT1 when I_SCVD corresponds to the fourth waveform 1104 and an eleventh waveform 1111 indicates I_BAT2 when I_CHGR indicates the seventh waveform 1107. A twelfth waveform 1112 indicates V_BAT1 when V_PA corresponds to the sixth waveform 1106 and a thirteenth waveform 1113 indicates V_BAT2 when V_CHGR corresponds to the ninth waveform 1109. A fourteenth waveform 1114 indicates voltage V_SYS of a battery selected as a sensing object Referring to FIG. 11, V_BAT1 may be higher than V_BAT2 while the battery is charged in the first power adjustment mode, and accordingly, the processor 599 may configure V_BAT1 as V_SNS. In the first power adjustment mode, a higher voltage can be input to the first battery 531 compared to the second battery 532, and accordingly, the first battery 531 may be charged relatively faster than the second battery 532. The second system 592 may function as a load consuming power while two batteries 531 and 532 are charged. Accordingly, the first battery 531 may be charged much faster than the second battery 532. As the charging is performed in the CC mode, V_SNS (e.g., V_BAT1) gradually increases and V_SNS (e.g., V_BAT1) may reach V_float (e.g., approx. 4.4V) at time point t1. Accordingly, when V_SNS (e.g., V_BAT1) reaches V_float, the processor 599 may switch the charging mode into a CV mode. As the charging is performed in the CV mode, I_SCVD gradually decreases and, at time point t2, reaches a second reference value causing mode switching. The second reference value may be activated when the second system 592 functions as a load. In a situation in which the second system 592 functions as a load, the second reference value may be configured with a value larger than the first reference value (e.g., 1.4 A) in order to more promptly complete the charging of the second battery 532. When I_SCVD reaches the second reference value at time point t2, the processor 599 may change the power adjustment mode from the first power adjustment mode to the second power adjustment mode. In response to the mode switching, the charging circuit 550 may output I_CHGR at I_CHGR_MAX (e.g., 3A). After the mode switching, the processor 599 may decrease V_CHGR_MAX to, from example, from 4.6V to 4.4V, so as to maintain V_SNS (e.g., V_BAT1) at V_float. At time point t3, the processor 599 recognizes that the first battery 531 is fully charged, and accordingly, the processor 599 may terminate the charging of the first battery 531 by switching CM1 into the OFF state and configure V_BAT2 as V_SNS. The processor 599 recognizes that V_SNS (e.g., V_BAT2) fails to reach V_float, and accordingly, the processor 599 may increase V_CHGR_MAX (V_CHGR) in order to more promptly complete the charging of the second battery 532. As V_CHGR increases, I_BAT2 may rapidly increase. Thereafter, as V_CHGR is limited to V_CHGR_MAX, I_BAT2 may gradually decrease. At time point t4, the processor 599 may recognize that the second battery 532 is fully charged, and accordingly, the processor 599 may terminate the charging of the second battery 532 by switching CM2 into the OFF state.

An electronic device according to various example embodiments may include: a connection terminal (e.g., the connection terminal 520 of FIG. 5) configured to connect to an external power supply device; a switching circuit (e.g., the switching circuit 580 of FIG. 5) including an input terminal (e.g., the input terminal 581 of FIG. 1) connected to the connection terminal, a first output terminal (e.g., the first output terminal 582a of FIG. 5), and a second output terminal (e.g., the second output terminal 582b of FIG. 5); a first battery (e.g., the first battery 531 of FIG. 5) and a second battery (e.g., the second battery 532 of FIG. 5) connected to the power supply device in series through the first output terminal the first and second batteries being physically separated from each other; a charging circuit (e.g., the charging circuit 550 of FIG. 5) configured to adjust a voltage or a current of power received through the second output terminal and output the adjusted voltage or current to the first battery and the second battery; a monitoring circuit (e.g., the first monitoring circuit 561 and/or the second monitoring circuit 562 of FIG. 5) configured to monitor a voltage of the first battery and a voltage of the second battery; a protection circuit (e.g., the first protection circuit 571 and/or the second protection circuit 572 of FIG. 5) configured to monitor a current charged to the first battery and a current charged to the second battery and to suspend charging of the first battery and charging of the second battery; and a processor (e.g., the processor 599 of FIG. 5) connected to the switching circuit, the charging circuit, the monitoring circuit, and the protection circuit, and connected to the power supply device through the connection terminal. The processor may be configured to: control the switching circuit to connect the input terminal to the first output terminal or the second output terminal; select one of the first battery and the second battery as a first sensing object using data indicating the voltage of the first battery and data indicating the voltage of the second battery, the data being received from the monitoring circuit; output a first control signal causing suspension of charging of the first sensing object to the protection circuit based on a result of monitoring of a current output from the first sensing object; select another one of the first battery and the second battery as a second sensing object based on the suspension of the charging of the first sensing object; and output a second control signal causing suspension of charging of the second sensing object to the protection circuit based on a result of monitoring of a current output from the second sensing object.

According to an example embodiment, the processor may be configured to select, as the first sensing object, a battery having a higher voltage among the first battery and the second battery.

According to an example embodiment, the processor may be configured: identify whether the power supply device corresponds to a model supporting a function of adjusting a voltage or a current, by performing data communication with the power supply device through the connection terminal; based on a result of the identification showing that the power supply device corresponds to a model supporting the adjusting function, control the switching circuit to connect the input terminal to the first output terminal as a first power adjustment mode; and based on the result of the identification showing that the power supply device does not correspond to a model supporting the adjusting function, control the switching circuit to connect the input terminal to the second output terminal as a second power adjustment mode.

According to an example embodiment, an anode (+) of the first battery may be connected to a first power terminal of the connection terminal while the input terminal is connected the first output terminal, a cathode (−) of the first battery may be connected to an anode (+) of the second battery through a power line, a cathode (−) of the second battery may be connected to a second power terminal of the connection terminal, and an output terminal of the charging circuit may be connected to the power line. According to an example embodiment, the processor may be configured to switch the first power adjustment mode into the second power adjustment mode while the first battery and the second battery are charged in a constant voltage (CV) mode. According to an example embodiment, the processor may be configured switch the first power adjustment mode into the second power adjustment mode based on a current output from the power supply device reaching a first reference value.

According to an example embodiment, the processor may be configured to switch the first power adjustment mode into the second power adjustment mode based on the current output from the power supply device reaching a second reference value larger than the first reference value in a state in which a system of the electronic device, configured to operate using charged power of the second battery, functions as a load consuming power while the second battery is charged.

According to an example embodiment, the processor may be configured to: (e.g., operation 634 of FIG. 6) increase a maximum output voltage of the power supply device based on the voltage of the second sensing object being lower than a designated target voltage in a state in which the first power adjustment mode is configured and the second sensing object is charged; and (e.g., operation 636 of FIG. 6) increase a maximum output voltage of the charging circuit based on the voltage of the second sensing object being lower than the designated target voltage in a state in which the second power adjustment mode is configured and the second sensing object is charged.

According to an example embodiment, the processor may be configured to: (e.g., operation 638 of FIG. 6) decrease a maximum output voltage of the power supply device based on the voltage of the first sensing object or the second sensing object being equal to or greater than a designated target voltage in a state in which the first power adjustment mode is configured; and (e.g., operation 639 of FIG. 6) decrease a maximum output voltage of the charging circuit based on the voltage of the first sensing object or the second sensing object being equal to or greater than the designated target voltage in a state in which the second power adjustment mode is configured.

According to an example embodiment, the electronic device may further include: a first housing; and a second housing connected to the first housing to be rotatable with respect to the first housing, wherein the first battery is disposed in an inner space of the first housing, and the second battery is disposed in an inner space of the second housing.

According to an example embodiment, the connection terminal, the switching circuit, and the charging circuit may be arranged in the inner space of the first housing, and the second battery may be connected to the charging circuit and the first output terminal through a power line crossing the first housing and the second housing.

According to an example embodiment, the monitoring circuit may include; a first monitoring circuit (e.g., the first monitoring circuit 561 of FIG. 5) disposed in the inner space of the first housing and configured to monitor a voltage of the first battery; and a second monitoring circuit (e.g., the second monitoring circuit 562 of FIG. 5) disposed in the inner space of the second housing and configured to monitor a voltage of the second battery.

According to an example embodiment, the protection circuit may include: a first protection circuit (e.g., the first protection circuit 571 of FIG. 5) disposed in the inner space of the first housing and configured to monitor a current charged to the first battery and to suspend charging of the first battery; and a second protection circuit (e.g., the second protection circuit 572 of FIG. 5) disposed in the inner space of the second housing and configured to monitor a current charged to the second battery and to suspend charging of the second battery.

In various example embodiments, an electronic device may include: a first housing (e.g., the first housing 511 of FIG. 5); a second housing (e.g., the second housing 512 of FIG. 5) connected to the first housing to be rotatable with respect to the first housing; a connection terminal (e.g., the connection terminal 520 o FIG. 5) disposed in an inner space of the first housing and configured to connect to an external power supply device; a switching circuit (e.g., the switching circuit 580 of FIG. 5) disposed in an inner space of the first housing, and including an input terminal (e.g., the input terminal 581 of FIG. 5) connected to the connection terminal, a first output terminal (e.g., the first output terminal 582a of FIG. 5), and a second output terminal (e.g., the second output terminal 582b of FIG. 5), and configured to connect the input terminal to the first output terminal or the second output terminal; a first battery (e.g., the first battery 531 of FIG. 5) disposed in the inner space of the first housing and connected to the power supply device through the first output terminal; a second battery (e.g., the second battery 532 of FIG. 5) disposed in an inner space of the second housing and connected to the power supply device through the first output terminal; at least one monitoring circuit (e.g., the first monitoring circuit 561 and/or the second monitoring circuit 562 of FIG. 5) configured to monitor a voltage of the first battery and a voltage of the second battery; a charging circuit (e.g., the charging circuit 550 of FIG. 5) disposed in the inner space of the first housing and configured to adjust a voltage or a current of power received through the second output terminal and output the adjusted voltage or current to the first battery and the second battery; a processor (e.g., the processor 599 of FIG. 5) connected to the switching circuit, the at least one monitoring circuit, and the charging circuit, and connected to the power supply device through the connection terminal. An anode (+) of the first battery may be connected to a first power terminal of the connection terminal while the input terminal is connected the first output terminal, a cathode (−) of the first battery may be connected to an anode (+) of the second battery through a power line crossing the first housing and the second housing, a cathode (−) of the second battery may be connected to a second power terminal of the connection terminal, and an output terminal of the charging circuit may be connected to the power line, the processor may be configured to: identify whether the power supply device corresponds to a model supporting a function of adjusting a voltage or a current, by performing data communication with the power supply device through the connection terminal; based on a result of the identification showing that the power supply device corresponds to a model supporting the adjusting function, connecting the input terminal to the first output terminal and controlling the adjusting function of the power supply device; recognizing that a voltage of the first battery or a voltage of the second battery reaches a designated target voltage using data received from the at least one monitoring circuit; and based on the voltage of the first battery or the voltage of the second battery reaching the designated target voltage, connecting the input terminal to the second output terminal and controlling the adjusting function of the charging circuit. According to an example embodiment, the electronic device may further include at least one protection circuit (e.g., the first protection circuit 571 and/or the second protection circuit 572 of FIG. 5) configured to monitor current charged to the first battery and current charged to the second battery and to suspend charging of the first battery and charging of the second battery, wherein the processor is configured to: output a first control signal causing the charging of the first battery to be suspended to at least one protection circuit based on a result of monitoring of the current charged to the first battery in a state in which the input terminal is connected to the first output terminal; and output a second control signal causing the charging of the second battery to be suspended to at least one protection circuit based on a result of monitoring of the current charged to the second battery in a state in which the input terminal is connected to the second output terminal.

According to an example embodiment, the processor may be configured to connect the input terminal to the second output terminal based on current output from the power supply device reaching a first reference value in a state in which the input terminal is connected to the first output terminal.

According to an example embodiment, the processor may be configured to connect the input terminal to the second output terminal based on current output from the power supply device reaching a second reference value larger than the first reference value in a state in which a system of the electronic device, operating using charged power of the second battery, functions as a load consuming power while the second battery is charged.

According to an example embodiment, the processor may be configured to increase a maximum output voltage of the charging circuit based on the voltage of the second battery being lower than the target voltage in a state in which the input terminal is connected to the second output terminal, charging of the first battery being terminated, and the second battery being charged.

According to an example embodiment, the processor may be configured to: decrease a maximum output voltage of the power supply device based on the voltage of the first battery or the voltage of the second battery being equal to or greater than the target voltage in a state in which the input terminal is connected to the first output terminal; and decrease a maximum output voltage of the charging circuit based on the voltage of the first battery or the voltage of the second battery being equal to or greater than the target voltage in a state in which the input terminal is connected to the second output terminal.

According to an example embodiment, the at least one monitoring circuit may include: a first monitoring circuit disposed in the inner space of the first housing and configured to monitor a voltage of the first battery; and a second monitoring circuit disposed in the inner space of the second housing and configured to monitor a voltage of the second battery. The embodiments of the disclosure provided herein and shown in the drawings are merely examples, and are not intended to limit the scope of the disclosure. Accordingly, it should be understood that the scope of the various example embodiments of the disclosure includes all modifications or modified forms drawn based on the various embodiments of the disclosure.

The invention claimed is:
1. An electronic device comprising:
a connection terminal configured to connect to an external power supply;
a switching circuit comprising an input terminal connected to the connection terminal, a first output terminal, and a second output terminal;
a first battery and a second battery connected to the power supply device in series through the first output terminal and physically separated from each other;
a charging circuit configured to adjust a voltage or a current of power received through the second output terminal and output the adjusted voltage or current to the first battery and the second battery;
a monitoring circuit configured to monitor a voltage of the first battery and a voltage of the second battery;

a protection circuit configured to monitor a current charged to the first battery and a current charged to the second battery and to suspend charging of the first battery and charging of the second battery; and a processor connected to the switching circuit, the charging circuit, the monitoring circuit, and the protection circuit, and connected to the power supply device through the connection terminal, wherein the processor is configured to:

control the switching circuit to connect the input terminal to the first output terminal or the second output terminal;

select one of the first battery and the second battery as a first sensing object using data indicating the voltage of the first battery and data indicating the voltage of the second battery, the data being received from the monitoring circuit;

output a first control signal causing suspension of charging of the first sensing object to the protection circuit based on a result of monitoring of a current output from the first sensing object;

select the other one of the first battery and the second battery as a second sensing object based on the suspension of the charging of the first sensing object; and output a second control signal causing suspension of charging of the second sensing object to the protection circuit based on a result of monitoring of a current output from the second sensing object.

2. The electronic device of claim 1, wherein the processor is configured to select, as the first sensing object, a battery having a higher voltage among the first battery and the second battery.

3. The electronic device of claim 1, wherein the processor is configured to:

identify whether the power supply device corresponds to a model supporting a function of adjusting a voltage or a current, by performing data communication with the power supply device through the connection terminal;

based on a result of the identification showing that the power supply device corresponds to a model supporting the adjusting function, control the switching circuit to connect the input terminal to the first output terminal as a first power adjustment mode; and based on the result of the identification showing that the power supply device does not correspond to a model supporting the adjusting function, control the switching circuit to connect the input terminal to the second output terminal as a second power adjustment mode.

4. The electronic device of claim 3, wherein an anode (+) of the first battery is connected to a first power terminal of the connection terminal while the input terminal is connected the first output terminal, wherein a cathode (−) of the first battery is connected to an anode (+) of the second battery through a power line, wherein a cathode (−) of the second battery is connected to a second power terminal of the connection terminal, and wherein an output terminal of the charging circuit is connected to the power line.

5. The electronic device of claim 4, wherein the processor is configured to switch the first power adjustment mode into the second power adjustment mode while the first battery and the second battery are charged in a constant voltage (CV) mode.

6. The electronic device of claim 5, wherein the processor is configured to switch the first power adjustment mode to the second power adjustment mode based on a current output from the power supply device reaching a first reference value.

7. The electronic device of claim 6, wherein the processor is configured to switch the first power adjustment mode to the second power adjustment mode based on the current output from the power supply device reaching a second reference value larger than the first reference value in a state in which a system of the electronic device, configured to operate using charged power of the second battery, functions as a load consuming power while the second battery is charged.

8. The electronic device of claim 3, wherein the processor is configured to:

increase a maximum output voltage of the power supply device based on the voltage of the second sensing object being lower than a designated target voltage in a state in which the first power adjustment mode is configured and the second sensing object is charged; and increase a maximum output voltage of the charging circuit based on the voltage of the second sensing object being lower than the designated target voltage in a state in which the second power adjustment mode is configured and the second sensing object is charged.

9. The electronic device of claim 3, wherein the processor is configured to:

decrease a maximum output voltage of the power supply device based on the voltage of the first sensing object or the second sensing object being equal to or greater than a designated target voltage in a state in which the first power adjustment mode is configured; and decrease a maximum output voltage of the charging circuit based on the voltage of the first sensing object or the second sensing object being equal to or greater than the designated target voltage in a state in which the second power adjustment mode is configured.

10. The electronic device of claim 1, further comprising:

a first housing; and a second housing connected to the first housing to be rotatable with respect to the first housing, wherein the first battery is disposed in an inner space of the first housing, and wherein the second battery is disposed in an inner space of the second housing.

11. The electronic device of claim 10, wherein the connection terminal, the switching circuit, and the charging circuit are arranged in the inner space of the first housing, and wherein the second battery is connected to the charging circuit and the first output terminal through a power line crossing the first housing and the second housing.

12. The electronic device of claim 10, wherein the monitoring circuit comprises:

a first monitoring circuit disposed in the inner space of the first housing and configured to monitor a voltage of the first battery; and a second monitoring circuit disposed in the inner space of the second housing and configured to monitor a voltage of the second battery.

13. The electronic device of claim 10, wherein the protection circuit comprises:

a first protection circuit disposed in the inner space of the first housing and configured to monitor a current charged to the first battery and suspend charging of the first battery; and a second protection circuit disposed in the inner space of the second housing and configured to monitor a current charged to the second battery and suspend charging of the second battery.

14. An electronic device comprising:
a first housing;
a second housing connected to the first housing to be rotatable with respect to the first housing;
a connection terminal disposed in an inner space of the first housing and configured to connect to an external power supply device;
a switching circuit disposed in an inner space of the first housing, the switching circuit comprising an input terminal connected to the connection terminal, a first output terminal, and a second output terminal, is the switching circuit configured to connect the input terminal to the first output terminal or the second output terminal;
a first battery disposed in the inner space of the first housing and connected to the power supply device through the first output terminal;
a second battery disposed in an inner space of the second housing and connected to the power supply device through the first output terminal;
at least one monitoring circuit configured to monitor a voltage of the first battery and a voltage of the second battery;
a charging circuit disposed in the inner space of the first housing and configured to adjust a voltage or a current of power received through the second output terminal and to output the adjusted voltage or current to the first battery and the second battery;
a processor connected to the switching circuit, the at least one monitoring circuit, and the charging circuit, and connected to the power supply device through the connection terminal,
wherein an anode (+) of the first battery is connected to a first power terminal of the connection terminal while the input terminal is connected the first output terminal, a cathode (−) of the first battery is connected to an anode (+) of the second battery through a power line crossing the first housing and the second housing, a cathode (−) of the second battery is connected to a second power terminal of the connection terminal, and an output terminal of the charging circuit is connected to the power line, and
wherein the processor is configured to:
identify whether the power supply device corresponds to a model supporting a function of adjusting a voltage or a current, by performing data communication with the power supply device through the connection terminal;
based on a result of the identification showing that the power supply device corresponds to a model supporting the adjusting function, connect the input terminal to the first output terminal and control the adjusting function of the power supply device;
recognize that a voltage of the first battery or a voltage of the second battery reaches a designated target voltage using data received from the at least one monitoring circuit; and
based on the voltage of the first battery or the voltage of the second battery reaching the designated target voltage, connect the input terminal to the second output terminal and control the adjusting function of the charging circuit.

15. The electronic device of claim 14, further comprising at least one protection circuit configured to monitor current charged to the first battery and current charged to the second battery and suspend charging of the first battery and charging of the second battery,
wherein the processor is configured to:
output a first control signal causing the charging of the first battery to be suspended to at least one protection circuit based on a result of monitoring of the current charged to the first battery in a state in which the input terminal is connected to the first output terminal; and
output a second control signal causing the charging of the second battery to be suspended to at least one protection circuit based on a result of monitoring of the current charged to the second battery in a state in which the input terminal is connected to the second output terminal.

* * * * *